United States Patent [19]

Gotou

[11] Patent Number: 5,196,365
[45] Date of Patent: Mar. 23, 1993

[54] METHOD OF MAKING SEMICONDUCTOR MEMORY DEVICE HAVING STACKED CAPACITOR

[75] Inventor: Hiroshi Gotou, Saitama, Japan

[73] Assignee: Fujitsu Limited, Kanagawa, Japan

[21] Appl. No.: 779,548

[22] Filed: Oct. 18, 1991

Related U.S. Application Data

[60] Division of Ser. No. 547,368, Jul. 3, 1990, abandoned, and a continuation of Ser. No. 742,261, Aug. 7, 1991, abandoned.

Foreign Application Priority Data

[30] Jul. 5, 1989 [JP] Japan ................................. 1-171827

[51] Int. Cl.⁵ .............................................. H01L 21/70
[52] U.S. Cl. ......................................... 437/52; 437/47; 437/48; 437/60; 437/228; 437/919
[58] Field of Search ............... 437/47, 48, 52, 60, 437/228, 233, 235, 238, 919; 357/23.6

[56] References Cited

U.S. PATENT DOCUMENTS 4,953,126 8/1990 Ema .................................. 357/23.6

Primary Examiner—Tom Thomas
Attorney, Agent, or Firm—Nikaido, Marmelstein, Murray & Oram

[57] ABSTRACT

A semiconductor memory device includes a substrate, a transfer transistor formed on the substrate and including drain and source regions, and a charge storage capacitor electrically coupled to one of the drain and source regions of the transfer transistor. The charge storage capacitor has a conductive base layer which is electrically coupled to the one of the drain and source regions of the transfer transistor, at least one conductive side wall connected to one end of the base layer, a plurality of fin-shaped parts which extend from the side wall in a plurality of levels generally parallel to the base layer, a dielectric layer which covers exposed surfaces of the base layer, the side wall and the fin-shaped parts, and a conductor layer which is formed on the dielectric layer to form an opposed electrode of the charge storage capacitor. The fin-shaped parts and the side wall form a storage electrode of the charge storage capacitor.

5 Claims, 22 Drawing Sheets

FIG.14A
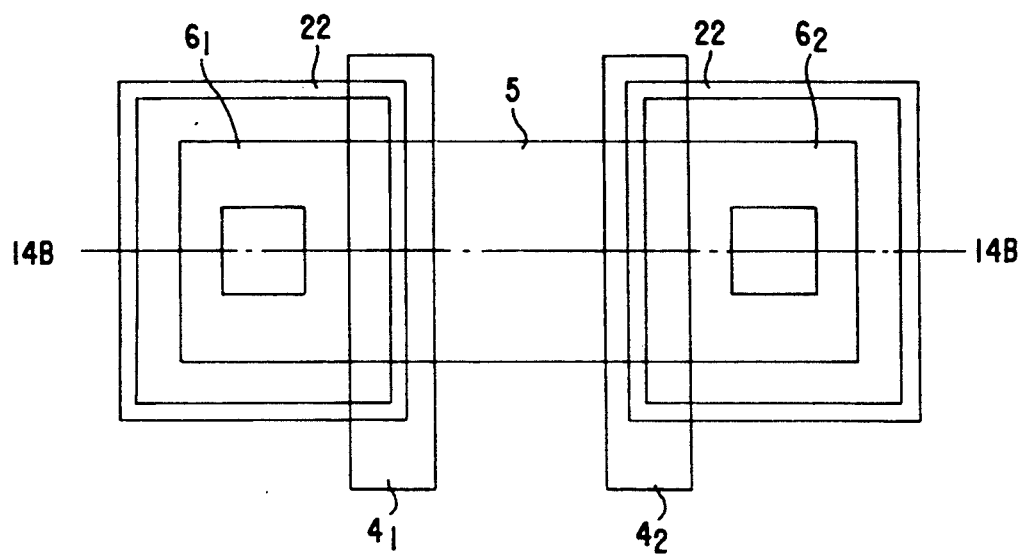
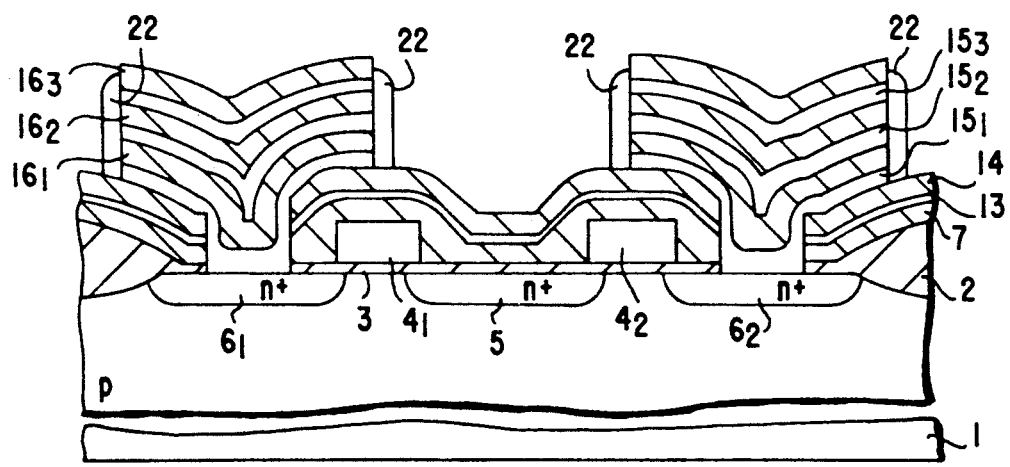
FIG.14B

FIG.15A
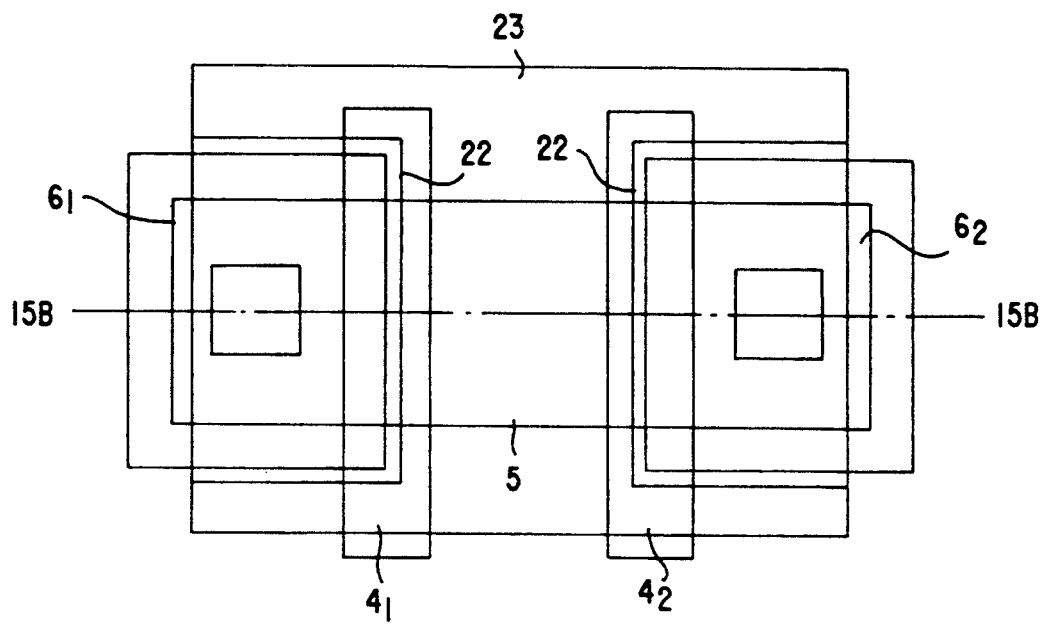
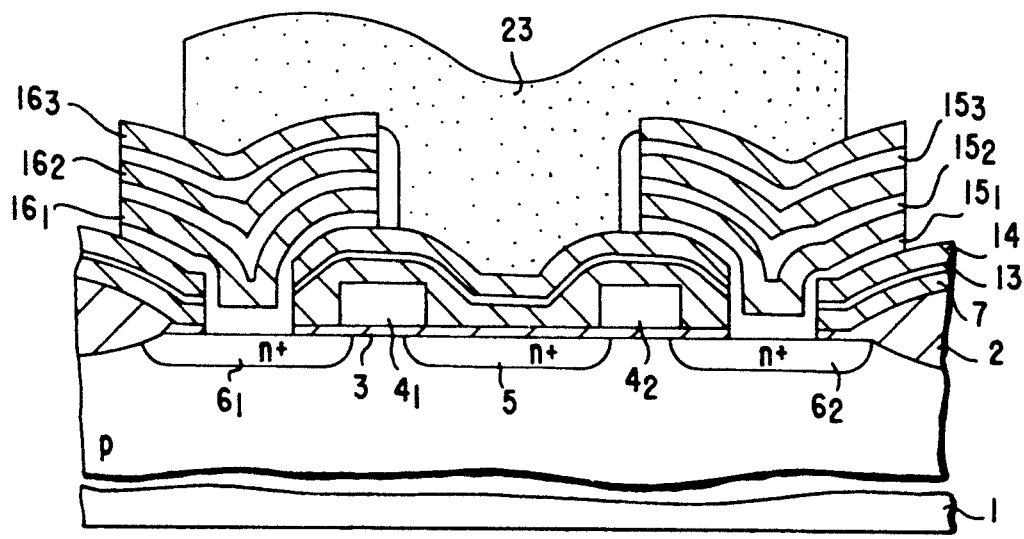
FIG.15B

FIG.16A
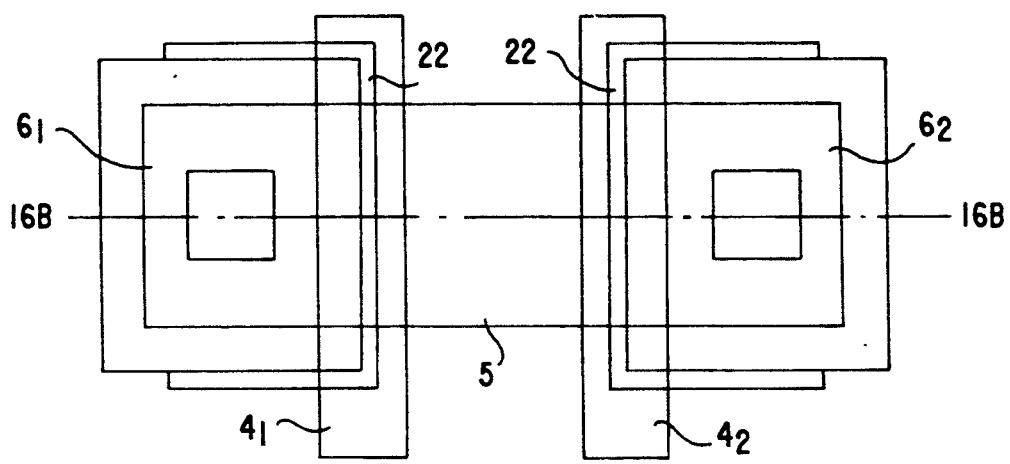
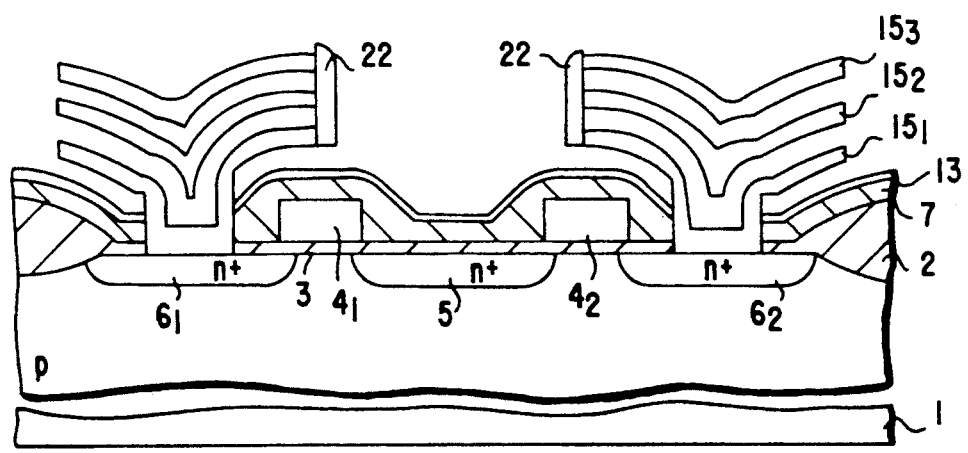
FIG.16B

FIG.18A
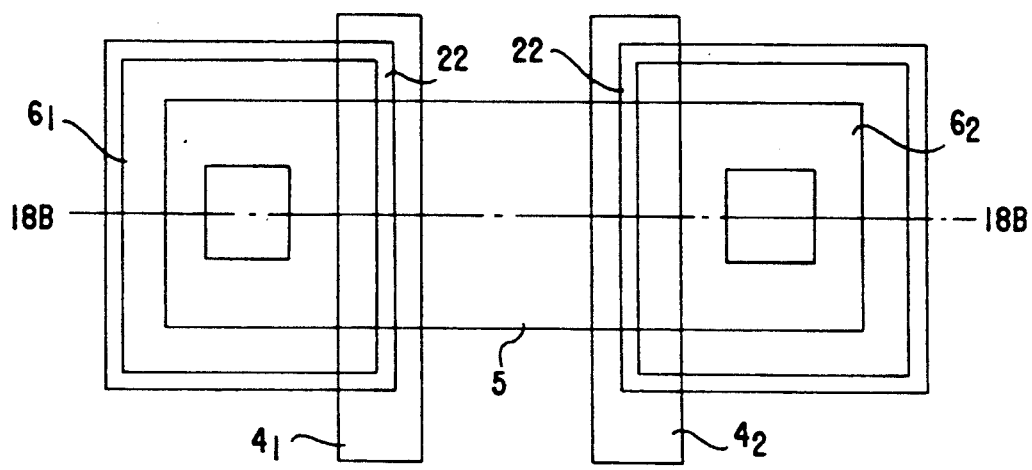
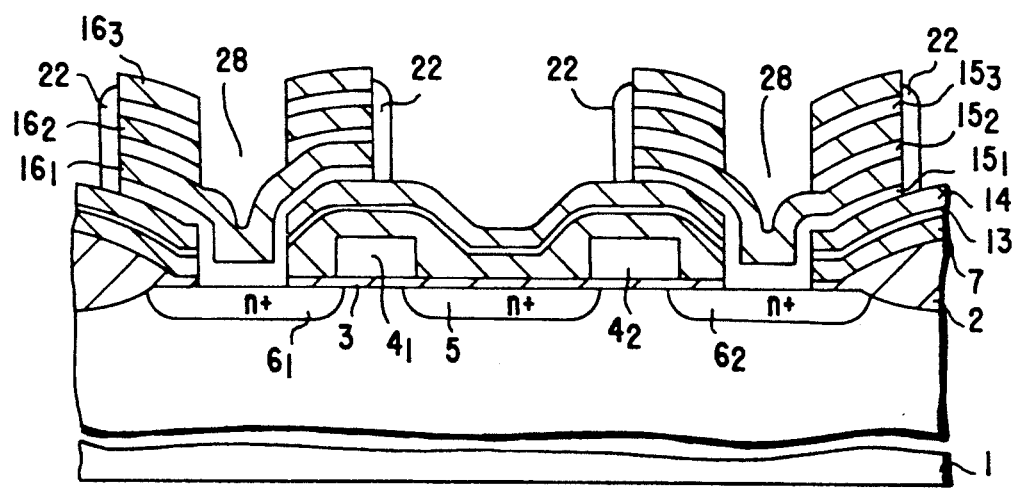
FIG.18B

FIG.19A
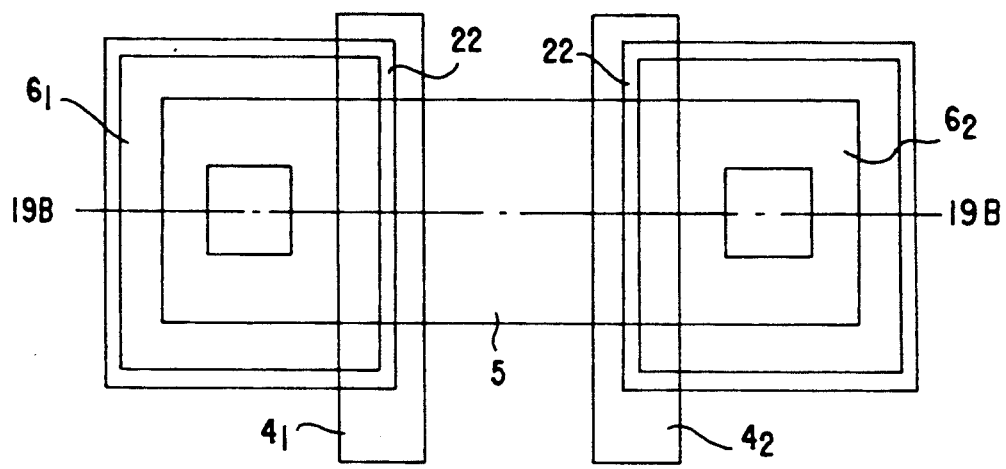
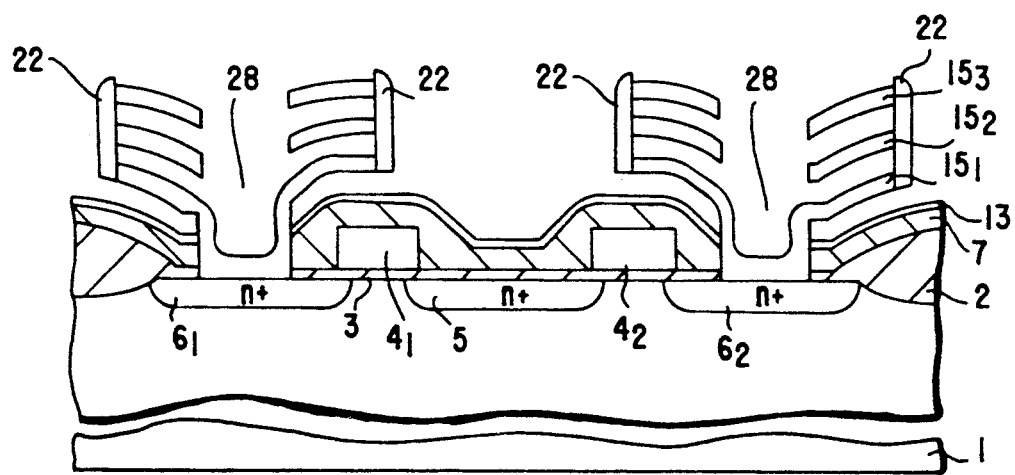
FIG.19B

FIG.22A
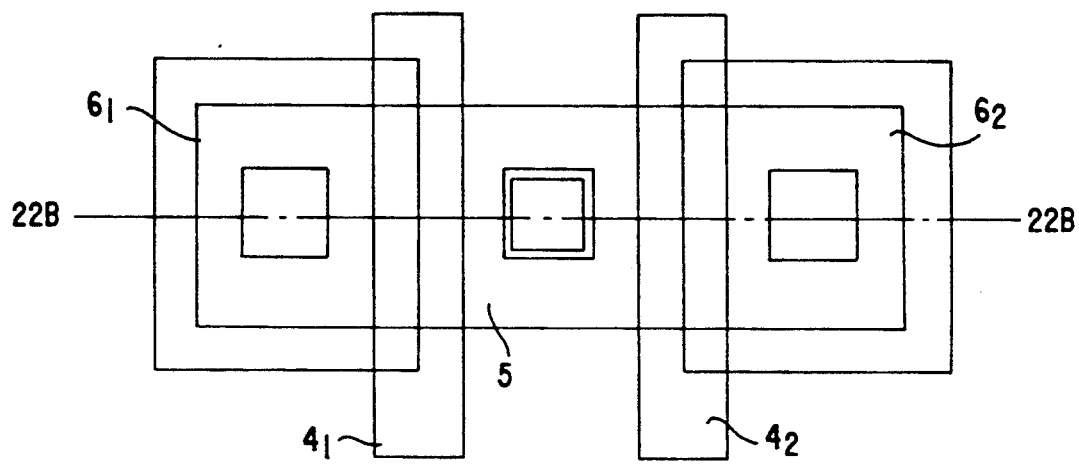
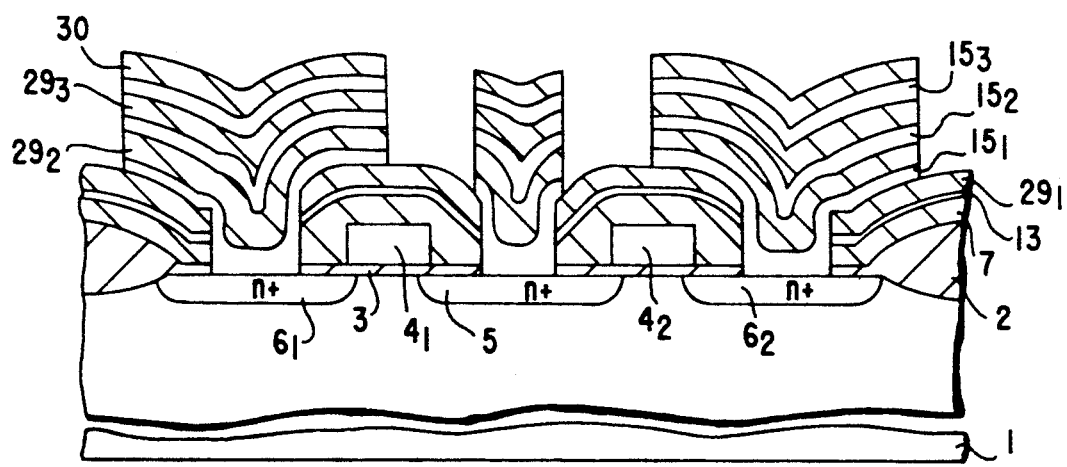
FIG.22B

FIG.23A
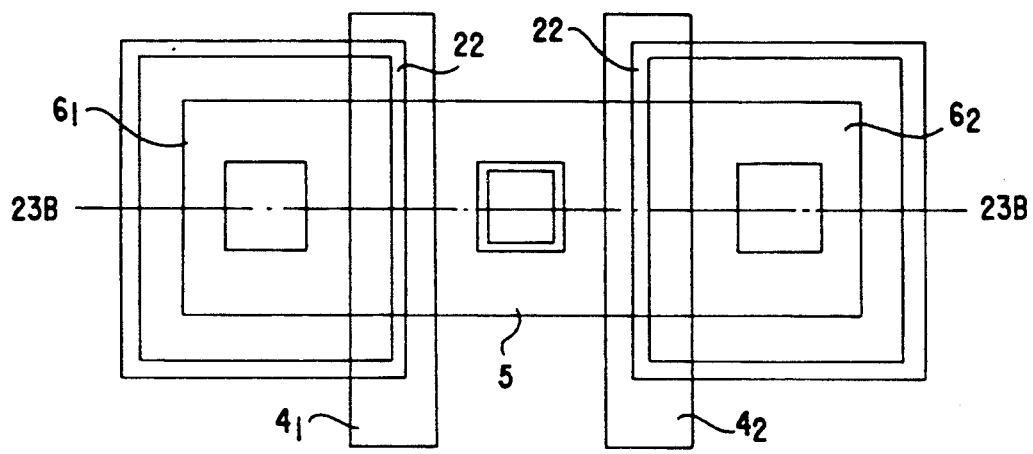
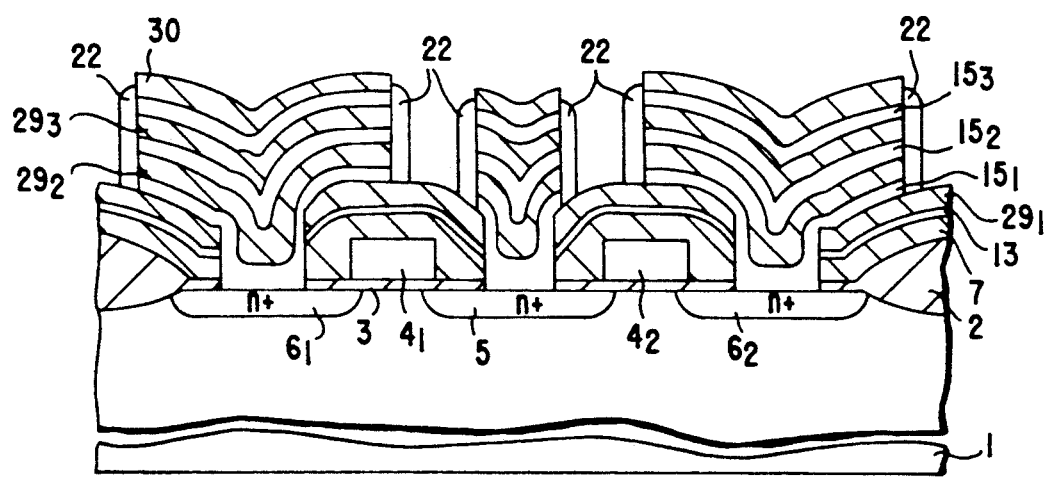
FIG.23B

FIG.25A
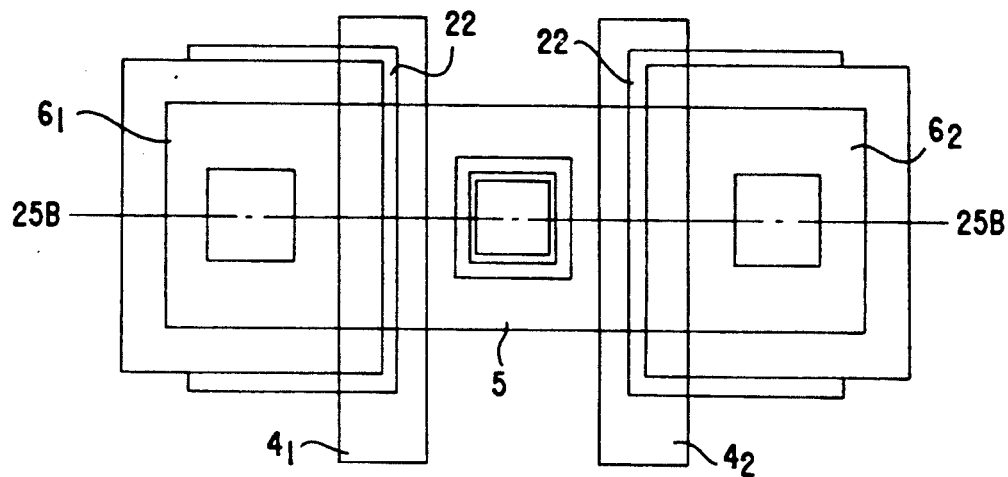
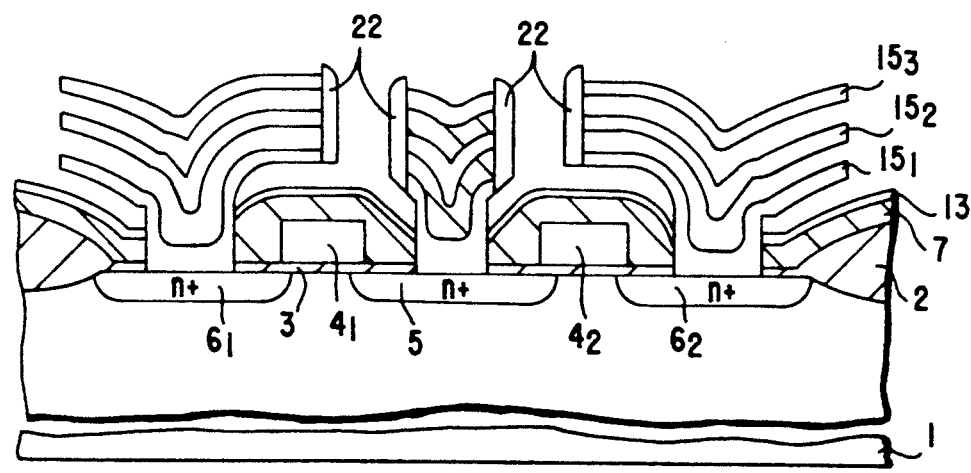
FIG.25B

FIG.26A
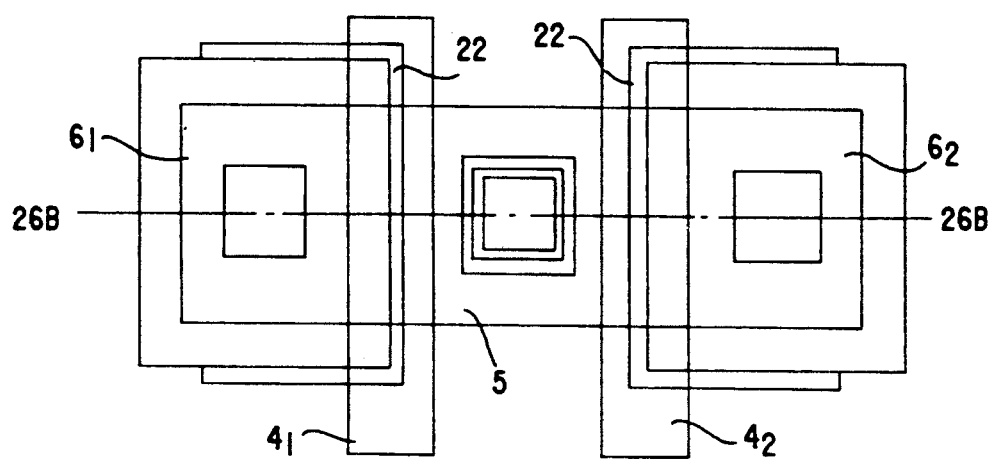
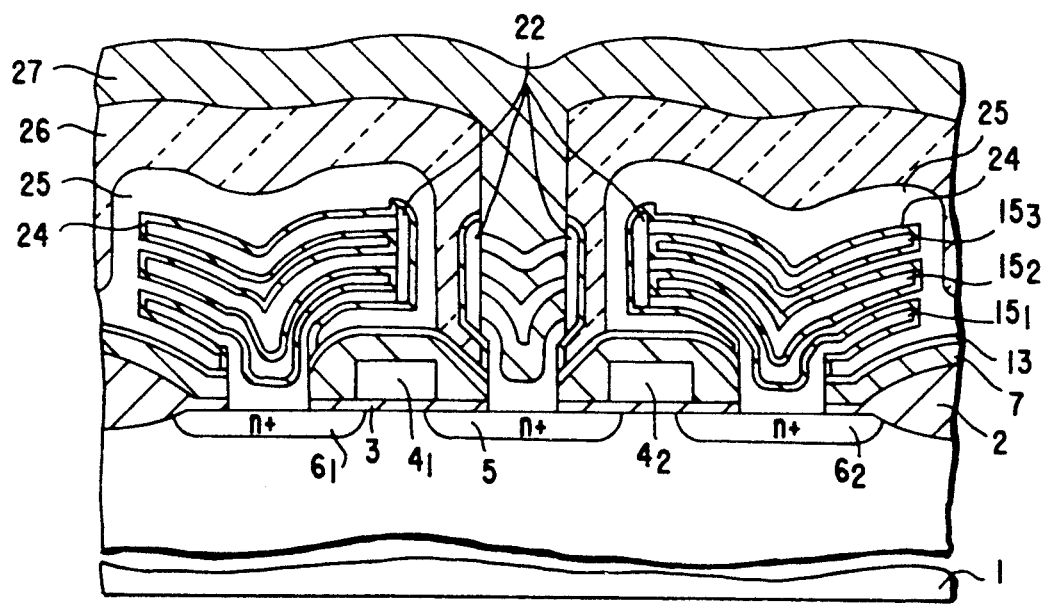
FIG.26B

FIG.27A
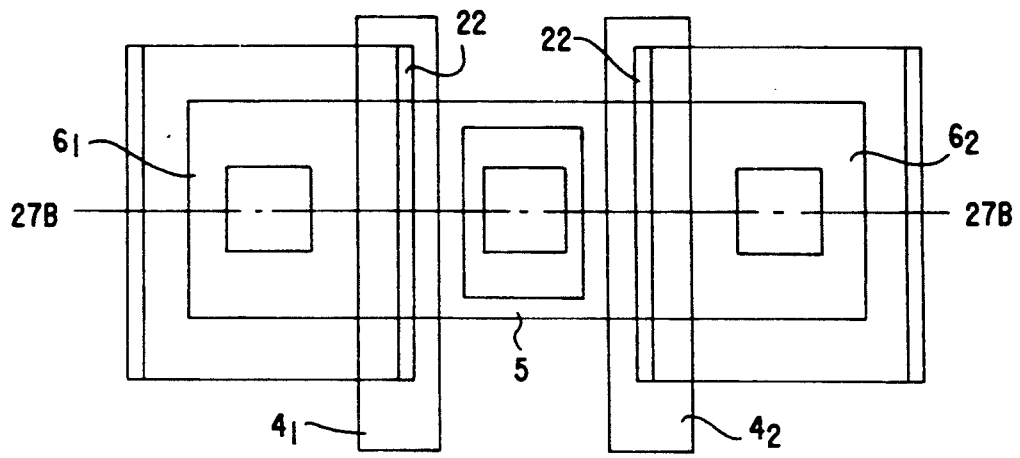
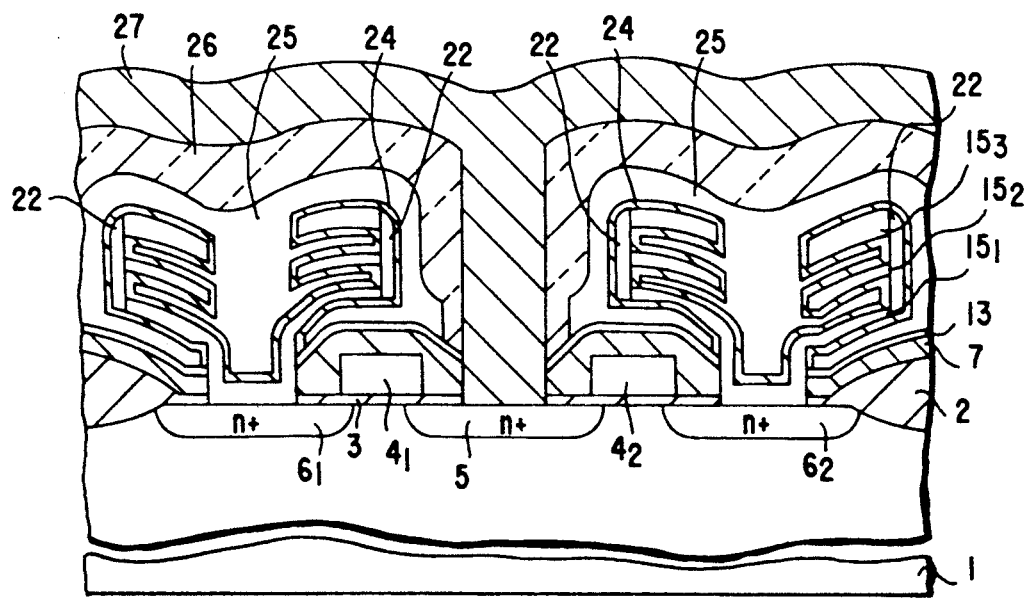
FIG.27B

METHOD OF MAKING SEMICONDUCTOR MEMORY DEVICE HAVING STACKED CAPACITOR

This is a division of application Ser. No. 547,368 filed on Jul. 3, 1990 now abandoned and continued as application Ser. No. 742,261 on Aug. 7, 1991 now abandoned.

BACKGROUND OF THE INVENTION

The present invention generally relates to semiconductor memory devices and methods of producing semiconductor memory devices, and more particularly to a semiconductor memory device which has a fin type stacked capacitor which is used as a charge storage capacitor and a method of producing such a semiconductor memory device.

Presently, a stacked capacitor or a trench capacitor is often used as a charge storage capacitor of a dynamic random access memory (DRAM).

Such charge storage capacitors occupy a relatively small area on a substrate but can realize a relatively large capacitance. Hence, it is expected that such charge storage capacitors can improve the integration density and the signal-to-noise (S/N) ratio of the DRAM at the same time. However, further improvements of such charge storage capacitors are still required.

Compared to the trench capacitor, the production of the stacked capacitor is simple. In addition, the reproducibility of the stacked capacitor is better compared to that of the trench capacitor.

Recently, a DRAM having the so-called fin type stacked capacitor is proposed in Ema et al., "3-Dimensional Stacked Capacitor Cell For 16M and 64M DRAMs", International Electron Devices Meeting, pp.592-595, December 1988. The fin type stacked capacitor includes electrodes and dielectric films which extend in a fin shape in a plurality of stacked layers.

Next, a description will be given of a method of producing the DRAM having the fin type stacked capacitor, by referring to FIGS.1 through 11.

In FIG. 1, a selective thermal oxidation (for example, local oxidation of silicon (LOCOS)) which uses an oxidation resistant mask such as a $Si_3N_4$ layer is employed to form a field insulator layer 2 on a p-type Si semiconductor substrate 1. The field insulator layer 2 is made of $SiO_2$ and has a thickness of 3000 Å, for example.

Then, the oxidation resistant mask is removed to expose an active region of the p-type Si semiconductor substrate 1.

A gate insulator layer 3 which is made of $SiO_2$ and has a thickness of 150 Å, for example, is formed on the substrate surface by a thermal oxidation.

A polysilicon layer having a thickness of 2000 Å, for example, is formed on the gate insulator layer 3 and the field insulator layer 2 by a chemical vapor deposition (CVD).

The polysilicon layer is doped by a p-type impurity by carrying out a thermal diffusion which uses $POCl_3$ as a source gas.

Next, a resist process of a normal photolithography technique and a reactive ion etching (RIE) using $CCl_4+O_2$ as an etching gas are used to pattern the polysilicon layer and form gate electrodes $4_1$ and $4_2$ which correspond to word lines.

The gate electrodes $4_1$ and $4_2$ are used as a mask and As ions are implanted by an ion implantation. In addition, a thermal process is carried out for activation, so as to form an n+-type source region 5 and an n+-type drain region 6. The n+-type source region 5 corresponds to a bit line contact region, and the n+-type drain region 6 corresponds to a storage electrode contact region. For example, the As ions are implanted with a dosage of $1 \times 10^{15}$ cm$^{-2}$.

Next, as shown in FIG.2, an interlayer insulator 7 is formed by a CVD. The interlayer insulator 7 is made of $SiO_2$ and has a thickness of 1000 Å, for example. The interlayer insulator 7 may be made of $Si_3N_4$.

A resist process of a normal photolithography technique and a RIE using $CHF_3+O_2$ as an etching gas are carried out to selectively etch the interlayer insulator 7 and form a bit line contact hole 7A.

Next, as shown in FIG.3, a CVD is carried out to form a polysilicon layer having a thickness of 500 Å, for example.

In order to make the polysilicon layer conductive, an ion implantation is carried out to implant As ions into the polysilicon layer with a dosage of $1 \times 10^{17}$ cm$^{-2}$ and an acceleration energy of 50 keV.

A CVD is carried out to form a $WSi_2$ layer having a thickness of 1000 Å, for example.

A resist process of a normal photolithography technique and a RIE using $CCl_4+O_2$ as an etching gas are carried out to pattern the polysilicon layer and the $WSi_2$ layer to form a bit line 12.

Next, as shown in FIG.4, an etching protection layer 13 having a thickness of approximately 1000 Å, for example, is formed by a CVD.

Then, as shown in FIG.5, a $SiO_2$ layer 14 and a polysilicon layer 15 are formed by a CVD. For example, the $SiO_2$ layer 14 and the polysilicon layer 15 respectively have a thickness of 1000 Å.

In order to make the polysilicon layer 15 conductive, an ion implantation is carried out to implant As ions with a dosage of $4 \times 10^{15}$ cm$^{-2}$ and an acceleration energy of 50 keV.

A $SiO_2$ layer 16 and a polysilicon layer 1 are formed by a CVD. In this case, the $SiO_2$ layer 16 and the polysilicon layer 17 respectively have a thickness of approximately 1000 Å.

In order to make the polysilicon layer 17 conductive, an ion implantation is carried out to implant As ions with a dosage of $4 \times cm^{312}$ and an acceleration energy of 50 keV.

An $SiO_2$ layer 18 is formed by a CVD. For example, the $SiO_2$ layer 18 has a thickness of approximately 1000 Å.

In FIG.6, a resist process of a normal photolithography technique and a RIE are carried out to selectively etch the $SiO_2$ layer 18 and the like. As a result, a storage electrode contact window 7B is formed. This storage electrode contact window 7B extends from a top surface of the $SiO_2$ layer 18 to a surface of the n+-type drain region 6. The etching gas is desirably $CHF_3+O_2$ for $SiO_2$, $CCl_4+O_2$ for polysilicon, and $CHF_3+O_2$ for $Si_3N_4$.

Next, as shown in FIG.7, a polysilicon layer 19 is formed by a CVD. In this case, the thickness of the polysilicon layer 19 is approximately 1000 Å.

In order to make the polysilicon layer 19 conductive, an ion implantation is carried out to implant As ions with a dosage of $4 \times 10^{15}$ cm$^{-2}$ and an acceleration energy of 50 keV.

In FIG.8, a resist process of a normal photolithography and RIEs using $CCl_4+O_2$ as the etching gas for polysilicon and using $CHF_3+O_2$ as the etching gas for $SiO_2$ are carried out to pattern the polysilicon layer 19, the $SiO_2$ layer 18, the polysilicon layer 17, the $SiO_2$ layer 16 and the polysilicon layer 15 and to form a storage electrode pattern.

Next, as shown in FIG.9, the structure shown in FIG.8 is submerged into a hydrofluoric acid such as $HF:H_2O = 1:10$, so as to remove the $SiO_2$ layers 18, 16 and 14. By carrying out this process, a fin-shaped storage electrode made of polysilicon is formed in a plurality of layers, that is, levels.

In addition, as shown in FIG.10, a thermal oxidation is carried out to form a dielectric layer 20 having a thickness of 100 Å, for example, on each surface of the polysilicon layers 19, 17 and 15. As an alternative, it is also possible to carry out a CVD in order to form a dielectric layer which is made of $Si_3N_4$ and has a thickness of 100 Å, for example, on each surface of the polysilicon layers 19, 17 and 15.

Then, as shown in FIG.11, an opposed electrode (cell plate) 21 which is made of polysilicon and has a thickness of 1000 Å, for example, is formed by a CVD. In addition, the opposed electrode 21 is doped by a p-type impurity by carrying out a thermal diffusion using $POCl_3$ as a source gas. Further, the opposed electrode 21 is patterned by a RIE using $CCl_4+O_2$ as an etching gas.

Although not shown in FIG.11, a passivation layer, a bonding pad, an underlayer interconnection for reducing the resistance of the word line, other interconnections and the like are formed to complete the DRAM.

The DRAM which is produced in the above described manner includes a fin type stacked capacitor which has a large capacitance. Hence, even when the size of the fin type stacked capacitor is made extremely small, it is still possible to obtain a sufficiently large information signal and a satisfactory S/N ratio is obtainable. In addition, the resistance against the α-ray is large.

When the fin type stacked capacitor having the above described structure is used to produce a 64 Mbit/chip DRAM, for example, the memory cell becomes extremely fine and various difficulties are encountered.

First, the polysilicon layers 19, 17 and 15 which become the fin-shaped storage electrode of the charge storage capacitor easily disconnect from the polysilicon layer 19 which forms a support part at the core of the capacitor. When the fin-shaped storage electrode disconnects and falls from the support part, the memory cell becomes defective, and in addition, the disconnected fin-shaped storage electrode in most cases act as a foreign particle which damages other memory cells.

Second, when forming the support part (a part of the polysilicon layer 19), the storage electrode contact window 7B which penetrates a plurality of layers is formed. But when forming the storage electrode contact window 7B, the storage electrode contact window 7B must be aligned with respect to the plurality of layers. Such an alignment is extremely difficult to make, and as a result, it is necessary to provide a large alignment margin.

Third, the area occupied by the charge storage capacitor on the substrate is not increased considerably. This is because the support part becomes relatively large compared to the fin-shaped storage electrode as the size of the charge storage capacitor is reduced. Consequently, the rate with which the capacitance is increased by the fin-shaped storage electrode decreases as the size of the charge storage capacitor is reduced.

SUMMARY OF THE INVENTION

Accordingly, it is a general object of the present invention to provide a novel and useful semiconductor memory device and a method of producing a semiconductor memory device in which the problems described above are eliminated.

Another and more specific object of the present invention is to provide a semiconductor memory device comprising a substrate, a transfer transistor formed on the substrate and including drain and source regions, and a charge storage capacitor electrically coupled to one of the drain and source regions of the transfer transistor. The charge storage capacitor has a conductive base layer which is electrically coupled to the one of the drain and source regions of the transfer transistor, at least one conductive side wall connected to one end of the base layer, a plurality of fin-shaped parts which extend from the side wall in a plurality of levels generally parallel to the base layer, a dielectric layer which covers exposed surfaces of the base layer, the side wall and the fin-shaped parts, and a conductor layer which is formed on the dielectric layer to form an opposed electrode of the charge storage capacitor. The fin-shaped parts and the side wall form a storage electrode of the charge storage capacitor. According to the semiconductor memory device of the present invention, the capacitance of the charge storage capacitor is approximately three times that of the conventional fin type charge storage capacitor because side wall functions as a part of the storage electrode. In addition, the fin-shaped parts of the storage electrode do not easily break during the production process. Furthermore, the alignment of the charge storage capacitor is simple.

Still another object of the present invention is to provide a method of producing a semiconductor memory device which includes a substrate, a transfer transistor formed on the substrate and a charge storage capacitor electrically coupled to one of drain and source regions of the transfer transistor, wherein the method comprises the steps of alternately forming first and second layers a plurality of times on an insulator layer which is formed on the substrate to form a stacked structure above the one of the drain and source regions of the transfer transistor, where at least the first layers are made of a conductive material and a lowermost one of the first layers is electrically coupled to the one of the drain and source regions of the transfer transistor via a contact hole in the insulator layer, forming at least one side wall on a side of the stacked structure, where the side wall is made of a conductive material and forming a storage electrode of the charge storage capacitor together with the first layers, removing the second layers of the stacked structure, forming a dielectric layer on exposed surfaces of the first layers and the side wall, and forming a conductor layer on surfaces of the dielectric layer to form an opposed electrode of the charge storage capacitor. According to the method of the present invention, the fin-shaped parts of the storage electrode do not easily break during the production process. Furthermore, the alignment of the charge storage capacitor is simple.

A further object of the present invention is to provide a method of producing a semiconductor memory device which includes a substrate, a transfer transistor formed on the substrate and a charge storage capacitor electrically coupled to one of drain and source regions of the transfer transistor, wherein the method comprises the steps of successively forming a gate insulator layer, a word line and a first interlayer insulator on the substrate, where the word line is located above the other of the drain and source regions of the transfer transistor, forming first and second contact holes in the first interlayer insulator and the gate insulator layer respectively above the one and the other of the drain and source regions of the transfer transistor, alternately forming first and second layers a plurality of times on the first interlayer insulator, where at least the first layers are made of a conductive material and a lowermost one of the first layers is electrically coupled to the drain and source regions of the transfer transistor via the first and second contact holes, patterning the first and second layers to form first and second stacked structures respectively above the first and second contact holes, forming at least one side wall on a side of each of the first and second stacked structures, where the side wall is made of a conductive material and the side wall on the first stacked structure forms a storage electrode of the charge storage capacitor together with the first layers, removing the second layers of the first stacked structure, forming a dielectric layer on exposed surfaces of the first layers of the first stacked structure and the side wall on the first stacked structure, forming a first conductor layer on surfaces of the dielectric layer to form an opposed electrode of the charge storage capacitor, forming a second interlayer insulator on the first conductor layer, forming a third contact hole in the second interlayer insulator to a top surface of the second stacked structure, and forming a second conductor layer on the second interlayer insulator, where the second conductor layer forms a bit line and is electrically coupled to the other of the drain and source regions of the transfer transistor via the third contact hole, the second stacked structure and the second contact hole. According to the method of the present invention, it is possible to prevent the bit line from breaking at the contact hole.

Other objects and further features of the present invention will be apparent from the following detailed description when read in conjunction with the accompanying drawings.

BRIEF DESCRIPTION OF THE DRAWINGS

FIGS.12A through 17A are plan views for explaining a first embodiment of a method of producing a semiconductor memory device according to the present invention for producing a first embodiment of a semiconductor memory device according to the present invention;

FIGS.12B through 17B are cross sectional views respectively along lines X—X in FIGS.12A through 17A for explaining the first embodiment;

FIGS.18A through 20A are plan views for explaining a second embodiment of the method of producing the semiconductor memory device according to the present invention for producing a second embodiment of the semiconductor memory device according to the present invention;

FIGS.18B through 20B are cross sectional views respectively along lines X—X in FIGS.18A through 20A for explaining the second embodiment;

FIGS.21A through 26A are plan views for explaining a third embodiment of the method of producing the semiconductor memory device according to the present invention for producing a third embodiment of the semiconductor memory device according to the present invention;

FIGS.21B through 26B are cross sectional views respectively along lines X—X in FIGS.21A through 26A for explaining the second embodiment;

FIG.27A is a plan view for explaining a fourth embodiment of the semiconductor memory device according to the present invention;

FIG.27B is a cross sectional view along a line X—X in FIG.27A for explaining the fourth embodiment;

DESCRIPTION OF THE PREFERRED EMBODIMENTS

Figure 1:
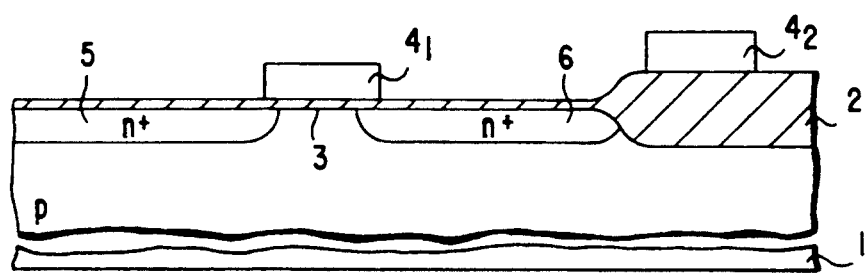
FIGS.1 through 11 are cross sectional views for explaining a method of producing a conventional DRAM having a fin type stacked capacitor.
Figure 2:
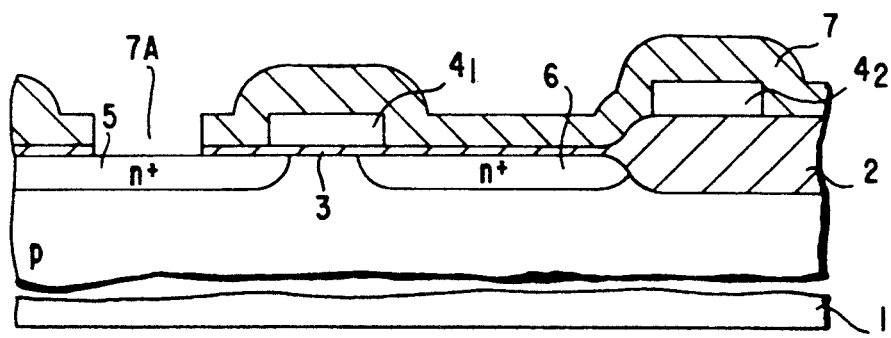
Figure 3:
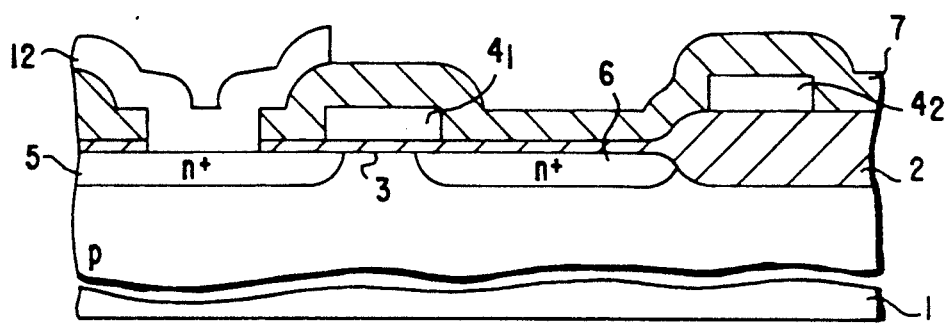
Figure 4:
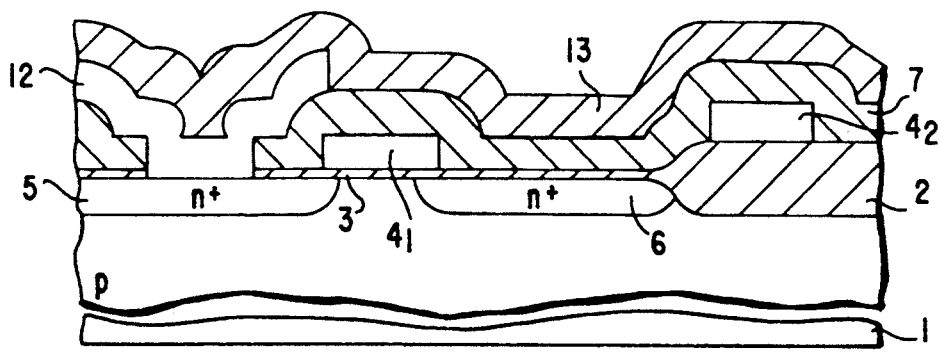
Figure 5:
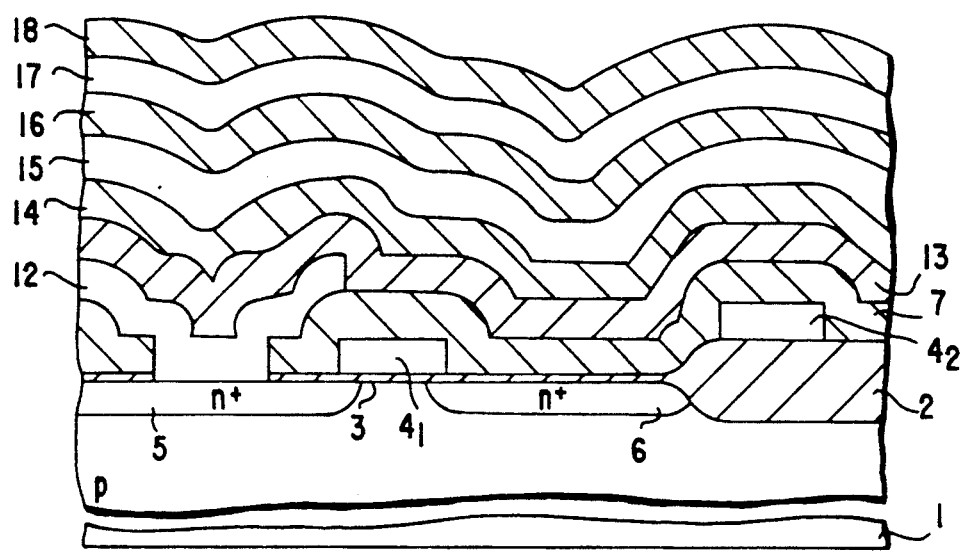
Figure 6:
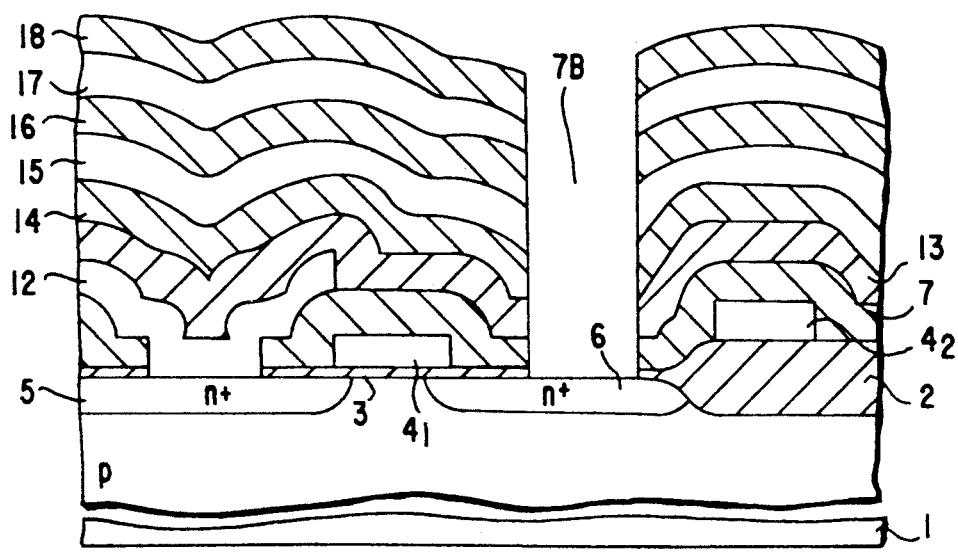
Figure 7:
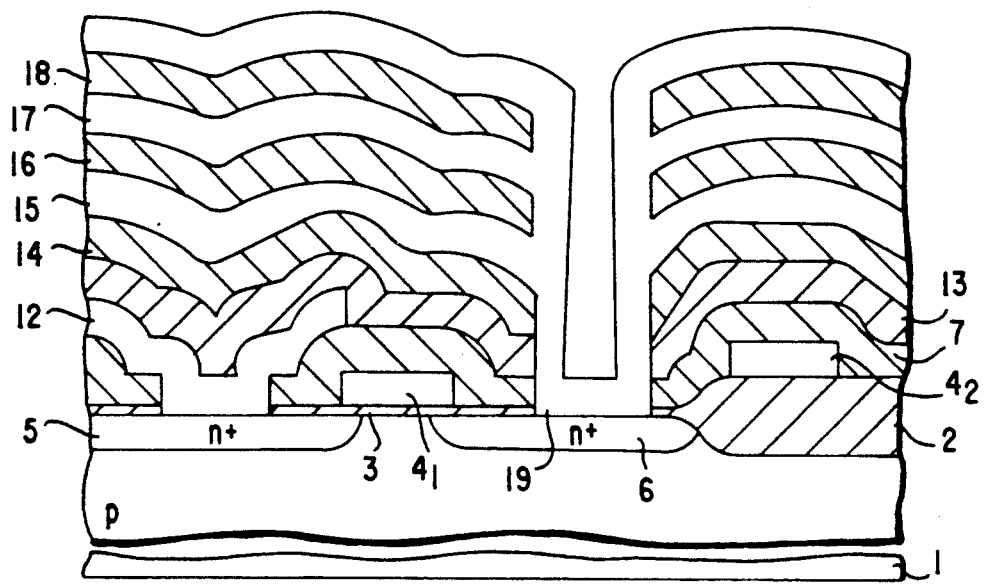
Figure 8:
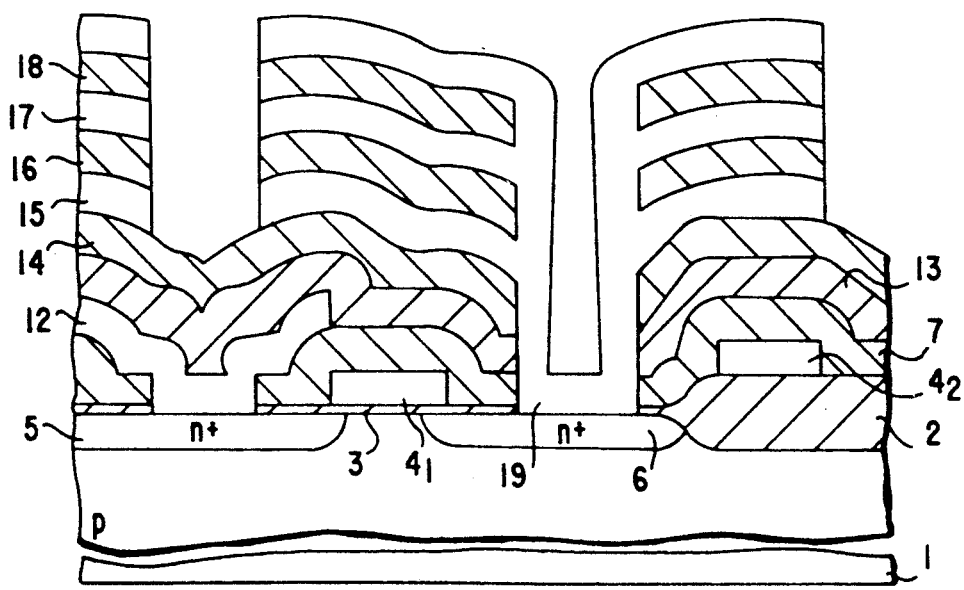
Figure 9:
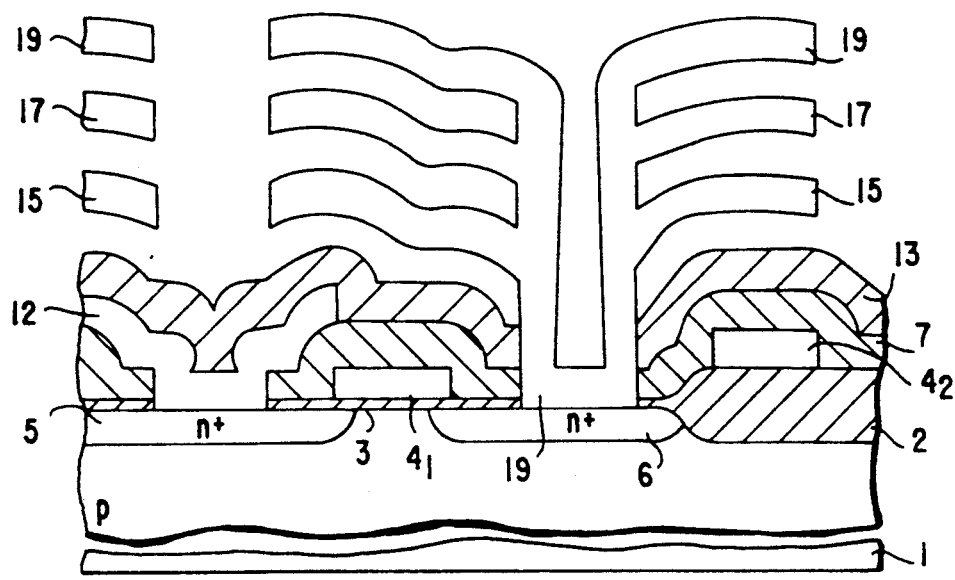
Figure 10:
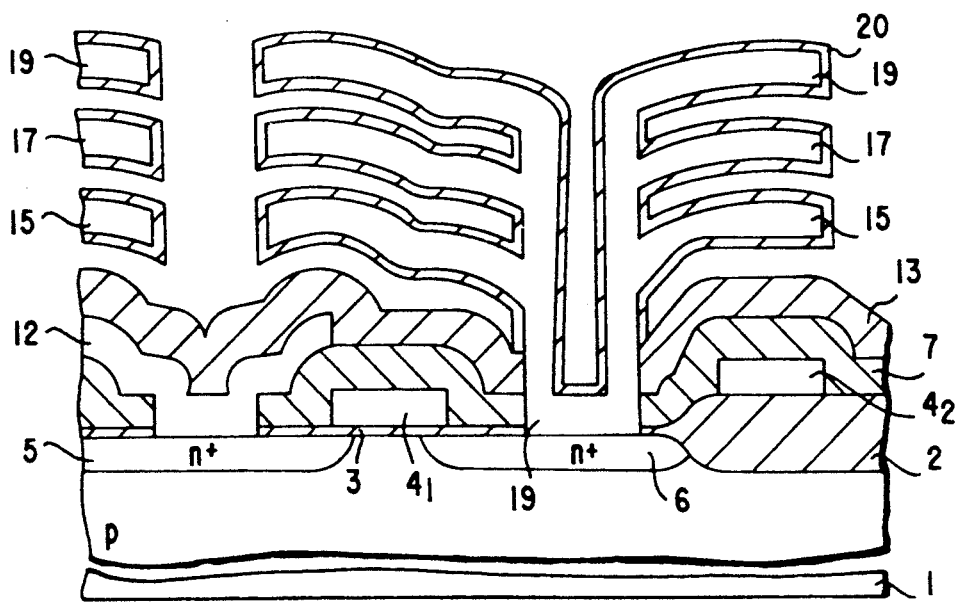
Figure 11:
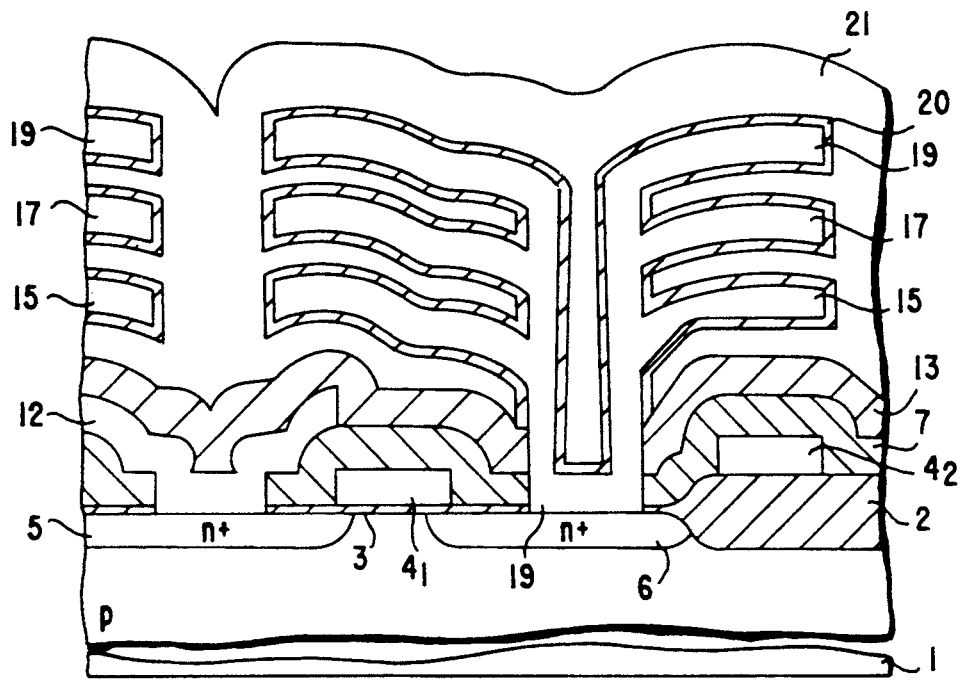

A description will be given of a first embodiment of a semiconductor memory device according to the present invention, by referring to FIGS.12 through 17. This embodiment of the semiconductor memory device is produced by a first embodiment of a method of producing a semiconductor memory device according to the present invention.

In FIGS.12 through 17, FIG.iA shows a plan view of an essential part of the semiconductor memory device and FIG.iB shows a cross section along a line X—X in FIG.iA, where i = 12 to 17. Furthermore, in FIGS.12 through 17, those parts which are essentially the same as those corresponding parts in FIGS.1 through 11 are designated by the same reference numerals.

In this embodiment, an n-channel transistor is used. However, it is of course possible to use a p-channel transistor.

Figure 12A:
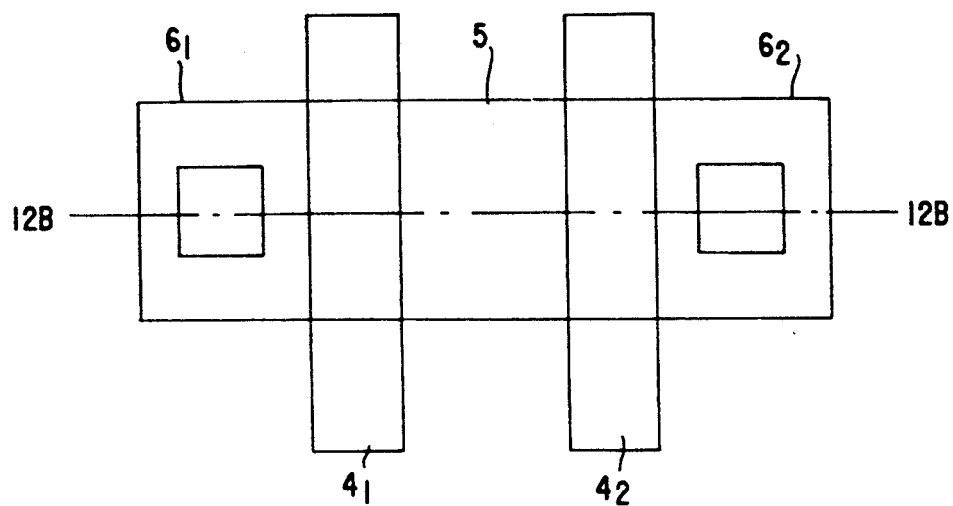
Figure 12B:
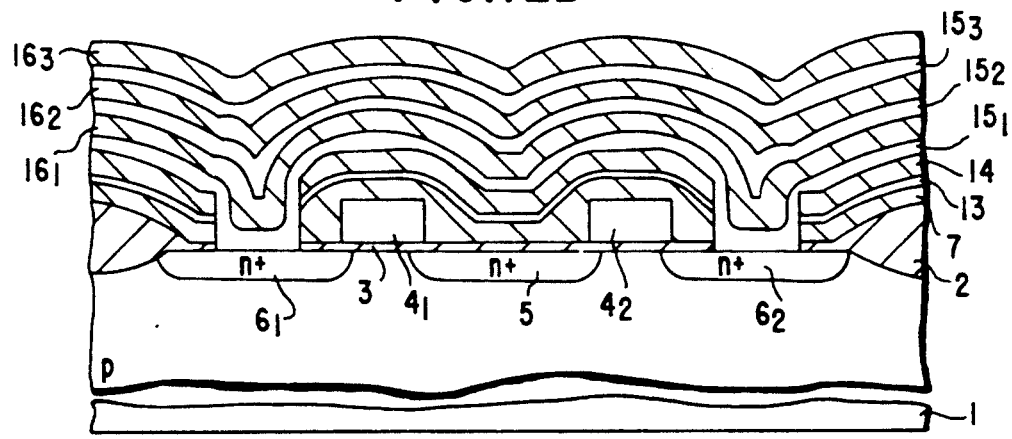

In FIGS.12A and 12B, known techniques are used to form on a p-type Si semiconductor substrate 1 a field insulator layer 2, a gate insulator layer 3, gate electrodes (word lines) $4_1$ and $4_2$ made of polysilicon, an n+-type source region 5, and n+-type drain regions $6_1$ and $6_2$.

CVDs are carried out to form an interlayer insulator 7 which is made of $SiO_2$ and has a thickness of 3000 Å, for example, an etching protection layer 13 which is made of $Si_3N_4$ and has a thickness of 500 Å, for example, and a spacer layer 14 which is made of $SiO_2$ and has a thickness of 2000 Å, for example. The interlayer insulator 7 may be made of $Si_3N_4$.

A resist process of a normal photolithography technique and a RIE using $CHF_3+O_2$ as an etching gas are carried out to selectively etch the spacer layer 14, the etching protection layer 13, the interlayer insulator 7, the gate insulator layer 3 and the like. As a result, storage electrode contact windows are formed above the drain regions $6_1$ and $6_2$.

CVDs are carried out to successively form a polysilicon layer $15_1$ having a thickness of 1000 Å, a $SiO_2$ layer $16_1$ having a thickness of 2000 Å, a polysilicon layer $15_2$ having a thickness of 1000 Å, a $SiO_2$ layer $16_2$ having a thickness of 2000 Å, a polysilicon layer $15_3$ having a thickness of 1000 Å, and a $SiO_2$ layer $16_3$ having a thickness of 2000 Å.

Figure 13A:
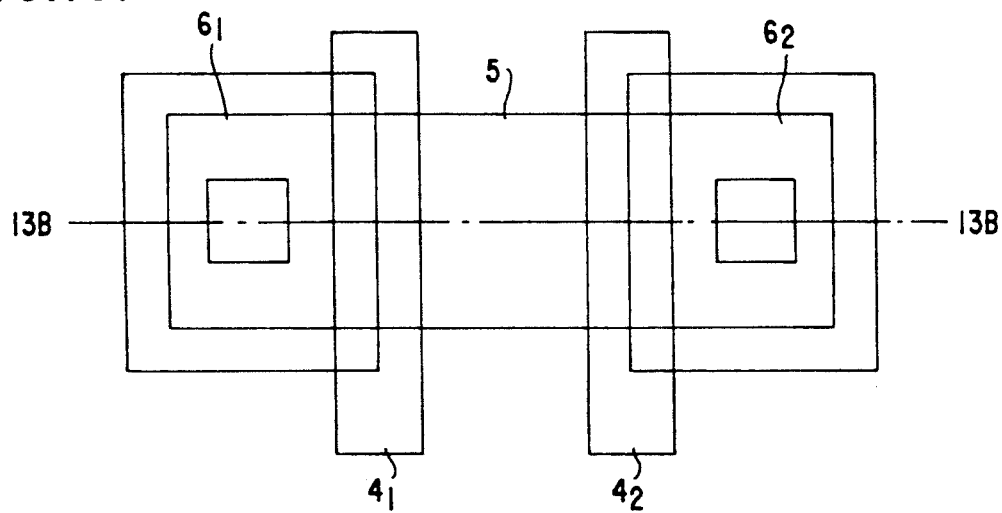
Figure 13B:
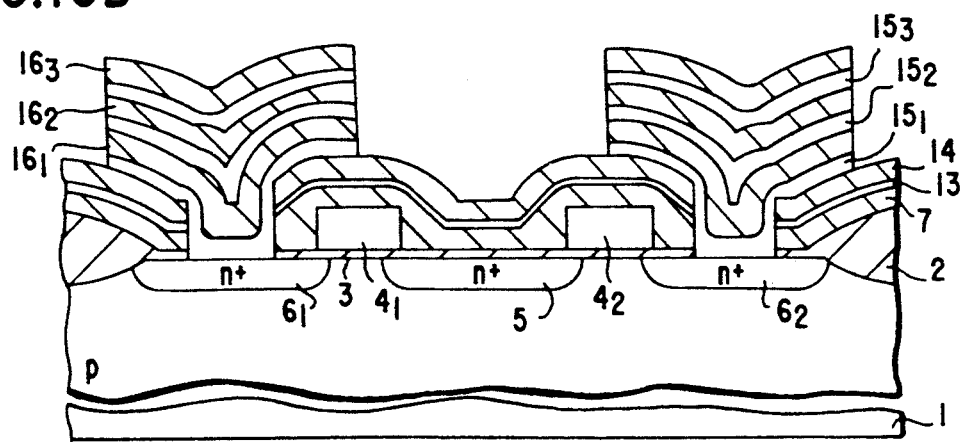

RIEs using $CF_4$ system etching gas are carried out to pattern the $SiO_2$ layer $16_3$, the polysilicon layer $15_3$, the $SiO_2$ layer $16_2$, the polysilicon layer $15_2$, the $SiO_2$ layer $16_1$ and the polysilicon layer $15_1$ by anisotropic etchings, so as to form a storage electrode pattern shown in FIGS.13A and 13B.

In FIGS.14A and 14B, a CVD is carried out to form a polysilicon layer having a thickness of 2000 Å, for example, on the entire top surface of the structure shown in FIGS.13A and 13B.

A RIE using CCl$_4$ system etching gas is carried out to pattern the polysilicon layer which is formed in the previous process by an anisotropic etching. As a result, side walls 22 made of polysilicon are formed on the sides of the storage electrode pattern. Each side wall 22 supports the polysilicon layers $15_1$, $15_2$ and $15_3$ in common and function as a conductive connector.

In FIGS.15A and 15B, a resist process of a normal photolithography technique is carried out to form a photoresist layer 23 which covers a large portion of the side walls 22.

A RIE using CF$_4$ system etching gas is carried out to remove the exposed portions of the side walls 22 by an isotropic etching.

In FIGS.16A and 16B, the photoresist layer 23 is removed before removing the spacer layer 14 by submerging the structure into a hydrofluoric acid etchant. In this case, the etching protection layer 13 made of Si$_3$N$_4$ acts as an etching stopper. The SiO$_2$ layers $16_3$, $16_2$ and $16_1$ are also removed at the same time as the etching of the spacer layer 14.

Figure 17A:
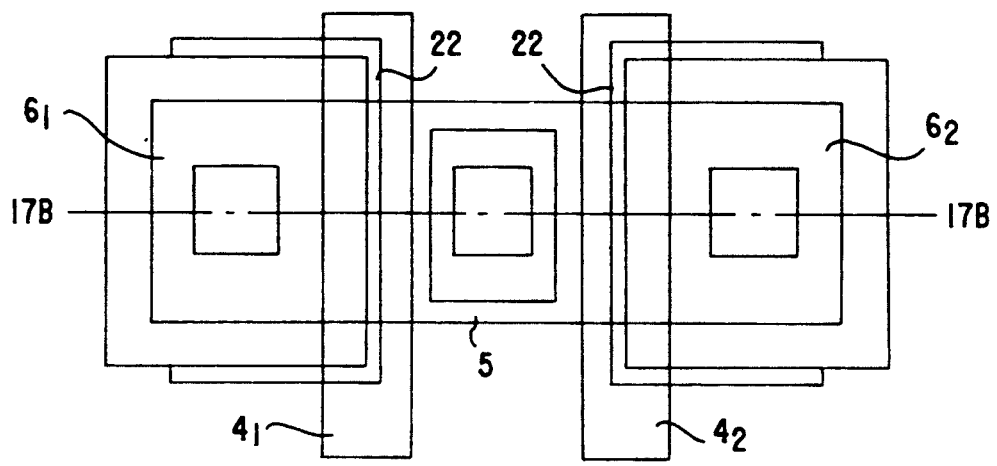
Figure 17B:
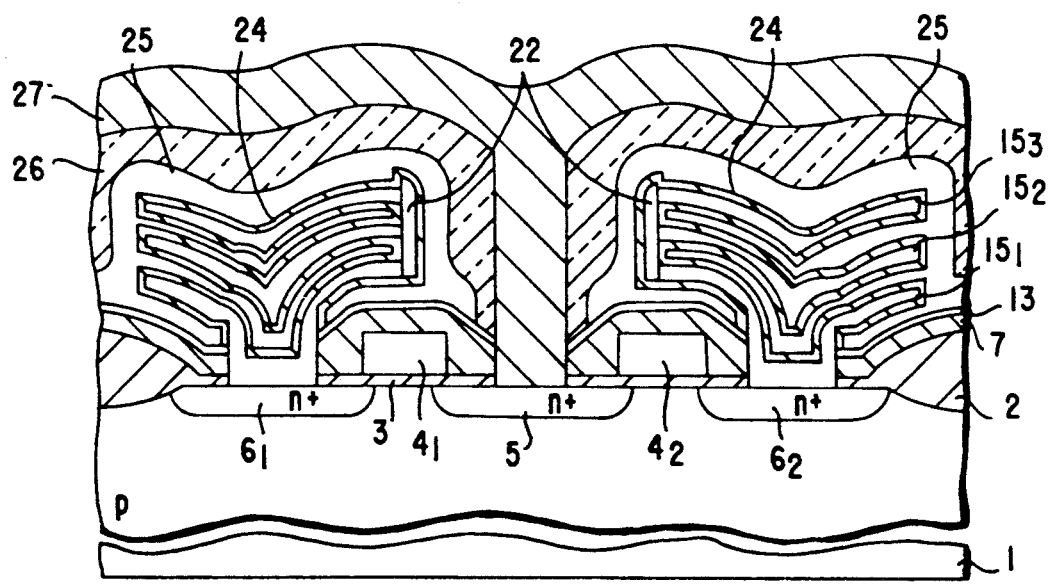

As shown in FIGS.17A and 17B, a thermal oxidation is carried out to form a dielectric layer 24 made of SiO$_2$ on the exposed portions of the polysilicon layers $15_3$, $15_2$ and $15_1$ made of polysilicon and the side walls 22 made of polysilicon.

Then, a CVD is carried out to form an opposed electrode (cell plate) 25 which is made of polysilicon and has a thickness of 5000 Å, for example.

A resist process of a normal photolithography technique and a RIE using CCl$_3$+O$_2$ as an etching gas are carried out to pattern the opposed electrode 25.

An interlayer insulator 26 which is made of phosphosilicate glass (PSG) and has a thickness of 1 μm, for example, is formed by a CVD.

A normal photolithography technique is used to selectively etch the interlayer insulator 26, the etching protection layer 13, the interlayer insulator 7 and the gate insulator layer 3, so as to form a bit line contact window.

A vacuum deposition and a normal photolithography technique are used to form a bit line 27 which is made of Al, for example.

Thereafter, known techniques are used to form an underlayer interconnection for reducing the resistance of the word lines $4_1$ and $4_2$, to form other interconnections, and to form bonding pads, passivation layers and the like to complete the semiconductor memory device.

In the semiconductor memory device which is produced in the above described manner, the polysilicon layers $15_1$, $15_2$ and $15_3$ function as the storage electrode. A large part of these polysilicon layers $15_1$, $15_2$ and $15_3$ is supported by the side walls 22 which are made of polysilicon and form a conductive support part. Hence, the strength of the storage electrode is improved and there is no need to provide a thick support part at the core as in the case of the conventional fin type semiconductor memory device.

In this embodiment, only one side of each side wall 22 is removed. However, it is also possible to remove other sides of the side wall 22. For example, in a case where it is difficult to fill the opposed electrode 25 between the etching protection layer 13 and the polysilicon layers $15_1$, $15_2$ and $15_3$, it is effective to remove the confronting sides of the side wall 22. Even in this case, the decrease in the strength of the storage electrode is suppressed to a negligible extent. In addition, by removing a portion of the side wall 22 at the bit line contact portion, it is possible to increase the alignment margin when forming the bit line contact window and also increase the etching margin.

In this embodiment, the storage electrode has three fins. However, the number of fins of the storage electrode is not limited to three, and two or four or more fins may be provided.

Next a description will be given of a second embodiment of the semiconductor memory device according to the present invention, by referring to FIGS.18 through 20. This embodiment of the semiconductor memory device is produced by a second embodiment of a method of producing the semiconductor memory device according to the present invention.

In FIGS.18 through 20, FIG.jA shows a plan view of an essential part of the semiconductor memory device and FIG.jB shows a cross section along a line X—X in FIG.jA, where j = 18 to 20. Furthermore, in FIGS.18 through 20, those parts which are essentially the same as those corresponding parts in FIGS.12 through 17 are designated by the same reference numerals, and a description thereof will be omitted. FIGS.18 through 20 only show essential production steps of the second embodiment.

In this embodiment, the production steps described in conjunction with FIGS.12 through 14 are carried out to form the side walls 22 similarly as in the case of the first embodiment. The production steps which fol'ow after the formation of the side walls 22 will now be described with reference to FIGS.18 through 20.

In FIGS.18A and 18B, a resist process of a normal photolithography technique and a RIE using a CCl$_4$ system etching gas, for example, are carried out to form openings 28 at centers of the storage electrode patterns. Each opening 28 extends from the top surface of the SiO$_2$ layer $16_3$ to the top surface of the SiO$_2$ layer $16_1$.

As shown in FIGS.19A and 19B, the photoresist layer which is formed when forming the openings 28 is removed before the structure shown in FIGS.18A and 18B is submerged into a hydrofluoric acid etchant so as to remove the SiO$_2$ layers $16_3$, $16_2$ and $16_1$. The hydrofluoric acid of course permeates through the openings 28.

Figure 20A:
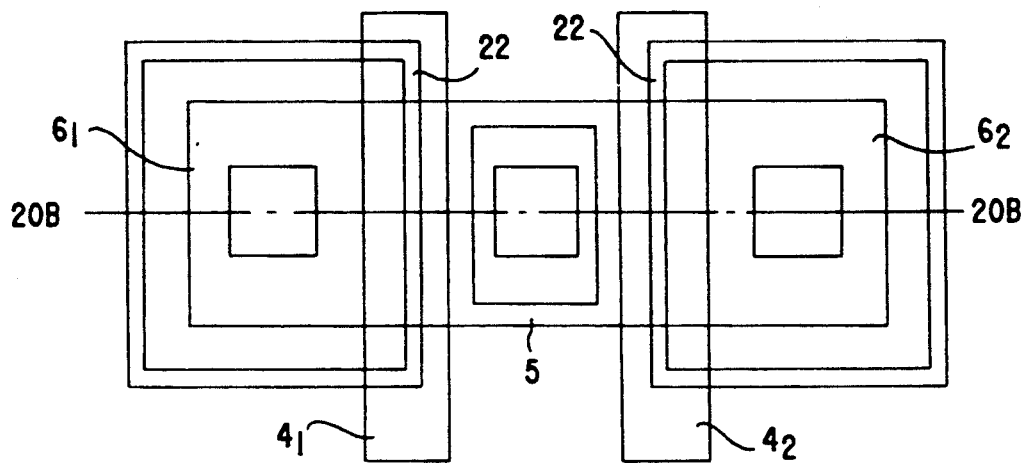
Figure 20B:
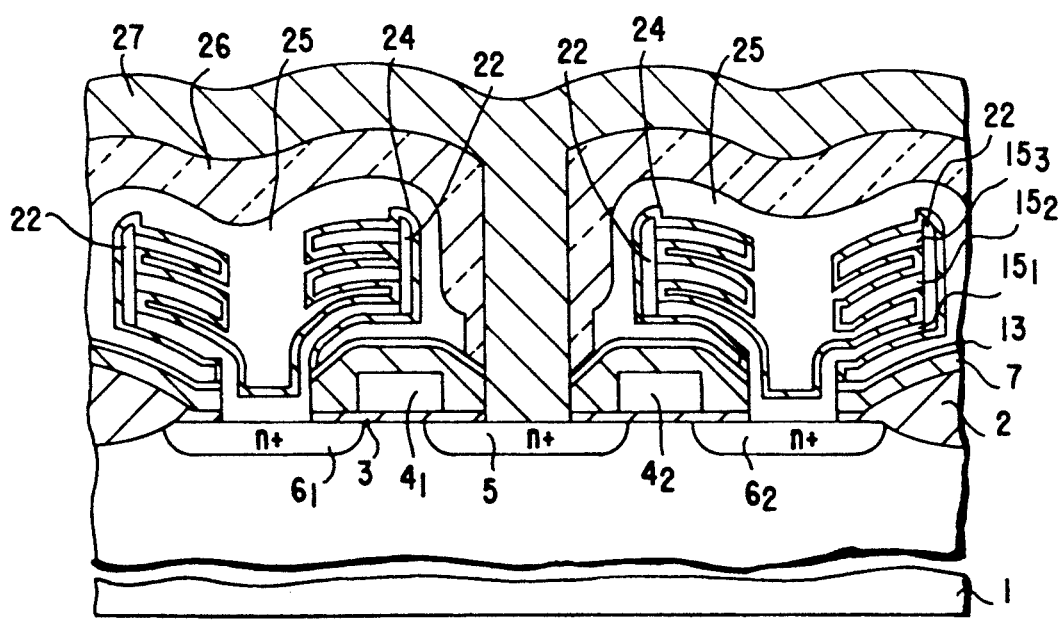

Next, as shown in FIGS.20A and 20B, a thermal oxidation is carried out to form a dielectric layer 24 which is made of SiO$_2$ on exposed portions of each of the polysilicon layers $15_3$, $15_2$ and $15_1$ and the side walls 22.

Then, opposed electrode (cell plate) 25 which is made of polysilicon and has a thickness of 5000 Å, for example, is formed by a CVD.

A resist process of a normal photolithography technique and a RIE using CCl$_4$+O$_2$ as an etching gas, for example, are carried out to pattern the opposed electrode 25.

An interlayer insulator 26 which is made of PSG and has a thickness of 1 μm is formed by a CVD.

A normal photolithography technique is used to selectively etch the interlayer insulator 26, the etching protection layer 13, the interlayer insulator 7 and the gate insulator layer 3, so as to form a bit line contact window.

A vacuum deposition and a normal photolithography technique are used to form a bit line 27 which is made of Al, for example.

Thereafter, known techniques are used to form an underlayer for reducing the resistance of the word lines $4_1$ and $4_2$, other interconnections, bonding pads, a passivation layer and the like to complete the semiconductor memory device.

In the semiconductor memory device which is produced in the above described manner, the entire periphery of the polysilicon layers $15_1$, $15_2$ and $15_3$ which function as the storage electrode is supported by the side wall 22 which is made of polysilicon and form a support part. Hence, the strength of the storage electrode is improved compared to the semiconductor memory device described in conjunction with FIGS.12 through 17.

The opening 28 need not necessarily have to be located at a center part of the region which is surrounded by the side walls 22. For example, the opening 28 may be located in a vicinity of a corner part of the region which is surrounded by the side walls 22.

Next, a description will be given of third embodiment of the semiconductor memory device according to the present invention, by referring to FIGS.21 through 26. This embodiment of the semiconductor memory device is produced by a third embodiment of a method of producing the semiconductor memory device according to the present invention.

In FIGS.21 through 26, FIG.kA shows a plan view of an essential part of the semiconductor memory device and FIG.kB shows a cross section along a line X—X in FIG.kA, where k =21 to 26. Furthermore, in FIGS.21 through 26, those parts which are essentially the same as those corresponding parts in FIGS.12 through 17 are designated by the same reference numerals, and a description thereof will be omitted. FIGS.21 through 26 only show essential production steps of the third embodiment.

Figure 21A:
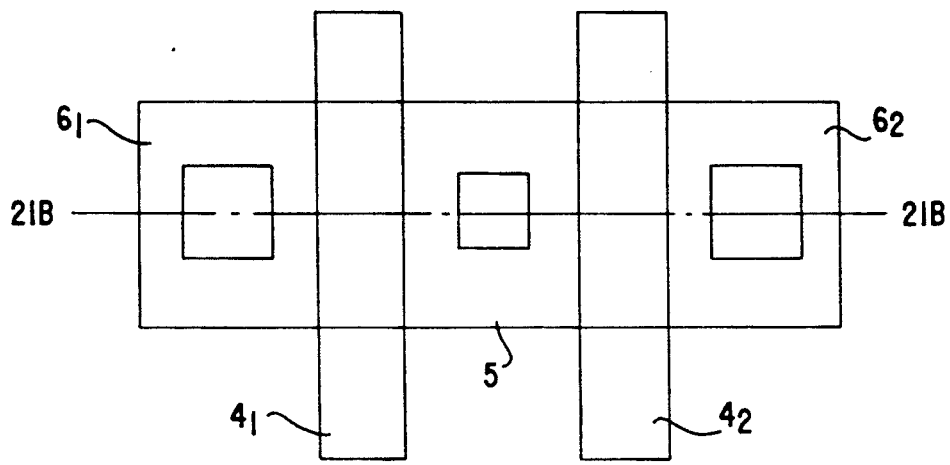
Figure 21B:
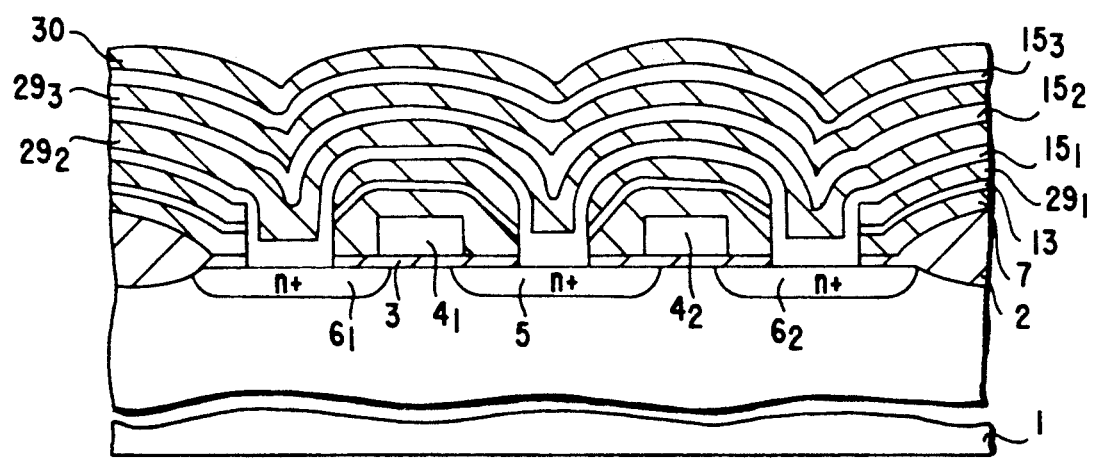

In FIGS.21A and 21B, known techniques are used to successively form on a p-type Si semiconductor substrate 1 a field insulator layer 2, a gate insulator layer 3, gate electrodes (word lines) $4_1$ and $4_2$ made of polysilicon, an n$^+$-type source region 5, and n$^+$-type drain regions $6_1$ and $6_2$.

An interlayer insulator 7 which is made of SiO$_2$ and has a thickness of 3000 Å, for example, and an etching protection layer 13 which is made of Si$_3$N$_4$ and has a thickness of 500 Å, for example, are successively formed by CVDs. The interlayer insulator 7 may be made of Si$_3$N$_4$.

A spacer layer $29_1$ which is made of carbon (C) and has a thickness of 2000 Å, for example, is formed by a sputtering process.

A resist process of a normal photolithography technique and a RIE using a CF$_4$ system etching gas, for example, are used to selectively etch the spacer layer $29_1$, the etching protection layer 13, the interlayer insulator 7, the gate insulator layer 3 and the like. As a result, a bit line contact window is formed above the source region 5 and a storage electrode contact windows are respectively formed above the drain regions $6_1$ and $6_2$.

A polysilicon layer $15_1$ having a thickness of 1000 Å, a spacer layer $29_2$ which is made of C and has a thickness of 2000 Å, a polysilicon layer $15_2$ having a thickness of 1000 Å, a spacer layer $29_3$ which is made of C and has a thickness of 2000 Å, a polysilicon layer $15_3$ having a thickness of 1000 Å, and a SiO$_2$ layer 30 having a thickness of 2000 Å are successively formed by an appropriate one of CVD and sputtering process. The CVD is used to form the polysilicon and SiO$_2$ layers. On the other hand, the sputtering process is used to form the spacer layers.

As shown in FIGS.22A and 22B, a RIE using CF$_4$+O$_2$ as an etching gas, for example, is carried out to pattern the SiO$_2$ layer 30, the polysilicon layer $15_3$, the spacer layer $29_3$, the polysilicon layer $15_2$, the spacer layer $29_2$ and the polysilicon layer $15_1$ by an anisotropic etching. As a result, a bit line contact part pattern and a storage electrode pattern are formed.

Next, as shown in FIGS.23A and 23B, a CVD is carried out to form a polysilicon layer which has a thickness of 2000 Å, for example, on the entire top surface of the structure shown in FIGS.22A and 22B. A RIE using a CCl$_4$ system etching gas, for example, is carried out to subject this polysilicon layer to an anisotropic etching. As a result, a side wall 22 which is made of polysilicon is formed at the sides of the plurality of layers of the bit line contact part pattern and the storage electrode pattern. The side wall 22 supports the polysilicon layers $15_1$, $15_2$ and $15_3$ and the spacer layers $29_2$ and $29_3$ in common, and also functions as a conductive connector.

Figure 24A:
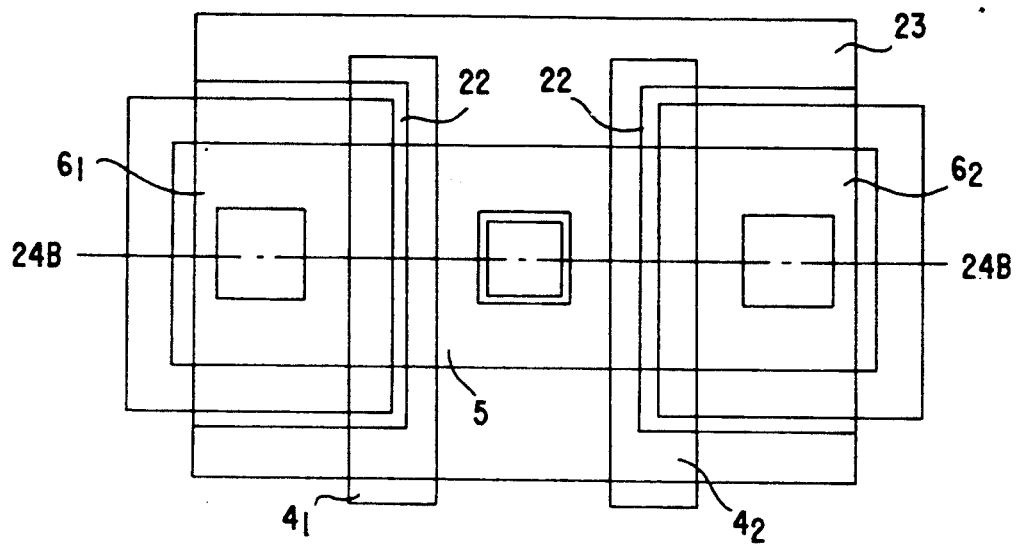
Figure 24B:
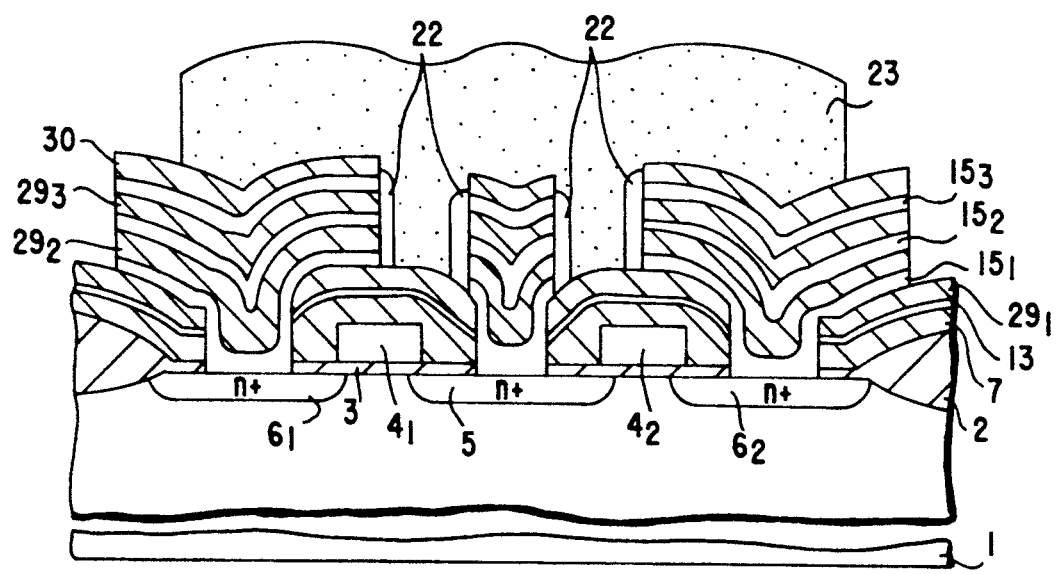

In FIGS.24A and 24B, a resist process of a normal photolithography technique is used to form a photoresist layer 23 which covers a large portion of the side walls 22.

A RIE using CF$_4$ as an etching gas is carried out to remove exposed portions of the side walls 22 by an isotropic etching.

Then, as shown in FIGS.25A and 25B, the photoresist layer 23 is removed, and the structure is submerged into a hydrofluoric acid etchant to remove the SiO$_2$ layer 30.

The spacer layers $29_3$, $29_2$ and $29_1$ are removed within oxygen plasma. This removal of the spacer layers $29_3$, $29_2$ and $29_1$ is carried out satisfactorily compared to the case described above where SiO$_2$ is used for the spacers. The spacer layers $29_2$, $29_2$ and $29_3$ remain at the bit line contact part because the peripheral parts of the spacer layers $29_1$, $29_2$ and $29_3$ are completely covered by the side walls 20.

Next, as shown in FIGS.26A and 26B, a dielectric layer 24 which is made of SiO$_2$ is formed on exposed portions of the polysilicon layers $15_1$, $15_2$ and $15_3$ and the side walls 22 by a thermal oxidation.

A CVD is carried out to form an opposed electrode (cell plate) 25 which is made of polysilicon and has a thickness of 5000 Å, for example.

A resist process of a normal photolithography technique and a RIE using CCl$_3$+O$_2$ as an etching gas are carried out to pattern the opposed electrode 25.

An interlayer insulator 26 which is made of PSG and has a thickness of 1 μm, for example, is formed by a CVD.

A normal photolithography technique is used to selectively etch the interlayer insulator 26 and the dielectric layer 24 which is formed on the polysilicon layer $15_3$ at the bit line contact part, so as to form a bit line contact window. The bit line contact part exists under the bit line contact window. For this reason, compared to the other embodiments, the aspect ratio of the bit line contact window in this embodiment is small. Consequently, it is possible to prevent the bit line from breaking. In addition, since the spacer layer made of C exists at the bit line contact part, the contact resistance of the bit line is reduced.

A vacuum deposition and a normal photolithography technique are used to form a bit line 27 which is made of Al, for example.

Thereafter, known techniques are used to form an underlayer for reducing the resistance of the word lines, other interconnections, bonding pads, a passivation layer and the like.

Next, a description will be given of a fourth embodiment of the semiconductor memory device according to the present invention, by referring to FIGS.27A and 27B. FIG.27A shows a plan view of an essential part of the semiconductor memory device and FIG.27B shows a cross section along a line X—X in FIG.27A. Furthermore, in FIGS.27A and 27B, those parts which are essentially the same as those corresponding parts in FIGS.12 through 17 are designated by the same reference numerals, and a description thereof will be omitted.

In this embodiment, the side walls 22 are only provided on two mutually confronting sides as shown in FIG.27A. In addition, the top part of the side wall 22 is rounded and the thickness of the polyilicon layer $15_3$ is greater than those of the polysilicon layers $15_2$ and $15_1$ to improve the mechanical strength. Therefore, it is possible to positively prevent the polysilicon layer $15_3$ from breaking off from the side wall 22.

Figure 28A:
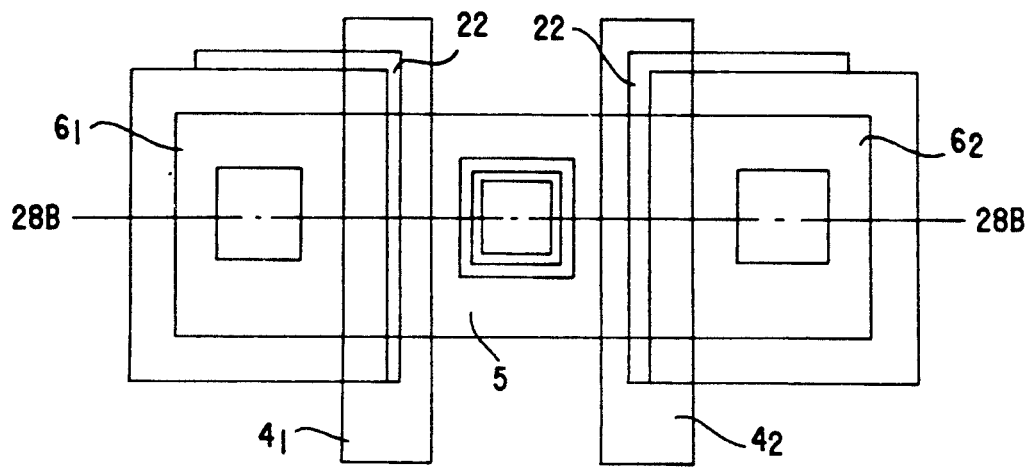
FIG.28A is a plan view for explaining a fifth embodiment of the semiconductor memory device according to the present invention.
Figure 28B:
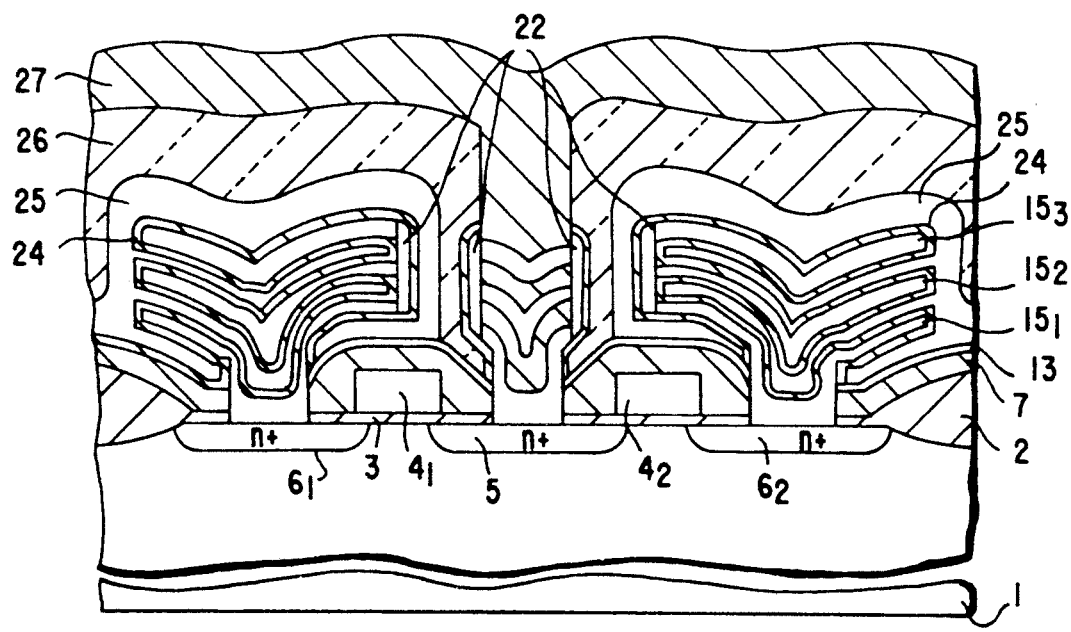
FIG.28B is a cross sectional view along a line X—X in FIG.28A for explaining the fifth embodiment.

Next, a description will be given of a fifth embodiment of the semiconductor memory device according to the present invention, by referring to FIGS.28A and 28B. FIG.28A shows a plan view of an essential part of the semiconductor memory device and FIG.28B shows a cross section along a line X—X in FIG.28A. Furthermore, in FIGS.28A and 28B, those parts which are essentially the same as those corresponding parts in FIGS.12 through 17 are designated by the same reference numerals, and a description thereof will be omitted.

In this embodiment, the side walls 22 are only provided on two mutually adjacent sides as shown in FIG.28A. In addition, the top part of the side wall 22 is rounded and the thickness of the polysilicon layer $15_3$ is greater than those of the polysilicon layers $15_2$ and $15_1$ to improve the mechanical strength. Therefore, it is possible to positively prevent the polysilicon layer $15_3$ from breaking off from the side wall 22.

Further, the present invention is not limited to these embodiments, but various variations and modifications may be made without departing from the scope of the present invention.

What is claimed is:

1. A method of producing a semiconductor memory device which includes a substrate, a transfer transistor formed on said substrate and a charge storage capacitor electrically coupled to one of drain and source regions of said transfer transistor, said method comprising the steps of:

alternately forming first and second layers a plurality of times on an insulator layer which is formed on said substrate to form a stacked structure above said one of the drain and source regions of said transfer transistor, at least said first layers being made of a conductive material, a lowermost one of said first layers being electrically coupled to said one of the drain and source regions of said transfer transistor via a contact hole in said insulator layer;

patterning said stacked structure to have a side at a position avoiding said contact hole;

forming at least one side wall on said side of said stacked structure at said position avoiding said contact hole, said side wall being made of a conductive material and forming a storage electrode of said charge storage capacitor together with said first layers;

removing the second layers of said stacked structure without removing said first layers immediately above said contact hole;

forming a dielectric layer on exposed surfaces of said first layers and said side wall; and forming a conductor layer on a surface of said dielectric layer to form an opposed electrode of said charge storage capacitor.

2. The method of producing the semiconductor memory device as claimed in claim 1, which further comprises the step of removing a portion of the side wall before removing the second layers of said stacked structure.

3. A method of producing a semiconductor memory device which includes a substrate, a transfer transistor formed on said substrate and a charge storage capacitor electrically coupled to one of drain and source regions of said transfer transistor, said method comprising the steps of:

successively forming a gate insulator layer, a word line and a first interlayer insulator on said substrate, said word line being located above the other of the drain and source regions of said transfer transistor;

forming first and second contact holes in said first interlayer insulator and said gate insulator layer respectively above said one and said other of the drain and source regions of said transfer transistor;

alternately forming first and second layers a plurality of times on said first interlayer insulator, at least said first layers being made of a conductive material, a lowermost one of said first layers being electrically coupled to the drain and source regions of said transfer transistor via said first and second contact holes;

patterning said first and second layers to form first and second stacked structures respectively above said first and second contact holes;

forming at least one side wall on a side of each of said first and second stacked structures, said side wall being made of a conductive material, said side wall on said first stacked structure forming a storage electrode of said charge storage capacitor together with said first layers;

removing the second layers of said first stacked structure;

forming a dielectric layer on exposed surfaces of said first layers of said first stacked structure and said side wall on said first stacked structure;

forming a first conductor layer on a surface of said dielectric layer to form an opposed electrode of said charge storage capacitor;

forming a second interlayer insulator on said first conductor layer;

forming a third contact hole in said second interlayer insulator to a top surface of said second stacked structure; and forming a second conductor layer on said second interlayer insulator, said second conductor layer forming a bit line and being electrically coupled to said other of the drain and source regions of said transfer transistor via said third contact hole, said second stacked structure and said second contact hole.

4. The method of producing the semiconductor memory device as claimed in claim 3 wherein said second layers are made of carbon.

5. The method of producing the semiconductor memory device as claimed in claim 3, which further comprises the step of removing a portion of the side wall before removing the second layers of said stacked structure.

* * * * *

UNITED STATES PATENT AND TRADEMARK OFFICE
CERTIFICATE OF CORRECTION

PATENT NO. : 5,196,365
DATED : March 23, 1993
INVENTOR(S) : Hiroshi GOTOU

It is certified that error appears in the above-identified patent and that said Letters Patent is hereby corrected as shown below:

On title page, item [60], third line, and column 1, lines 8-9 change "abandoned" to --Pat. No. 5,126,810--

Signed and Sealed this

Twenty-second Day of March, 1994

Attest:

BRUCE LEHMAN

Attesting Officer     Commissioner of Patents and Trademarks